US009448288B2

(12) United States Patent
Diaconu

(10) Patent No.: US 9,448,288 B2
(45) Date of Patent: Sep. 20, 2016

(54) MAGNETIC FIELD SENSOR WITH IMPROVED ACCURACY RESULTING FROM A DIGITAL POTENTIOMETER

(71) Applicant: Allegro Microsystems, LLC, Worcester, MA (US)

(72) Inventor: Aurelian Diaconu, Londonderry, NH (US)

(73) Assignee: Allegro Microsystems, LLC, Worcester, MA (US)

( * ) Notice: Subject to any disclaimer, the term of this patent is extended or adjusted under 35 U.S.C. 154(b) by 300 days.

(21) Appl. No.: 14/282,664

(22) Filed: May 20, 2014

(65) Prior Publication Data

US 2015/0338473 A1 Nov. 26, 2015

(51) Int. Cl.
*G01R 33/07* (2006.01)
*G01R 33/00* (2006.01)
*G01D 5/14* (2006.01)

(52) U.S. Cl.
CPC ........... *G01R 33/0029* (2013.01); *G01D 5/145* (2013.01); *G01R 33/0088* (2013.01); *G01R 33/07* (2013.01); *G01R 33/075* (2013.01); *G01R 33/077* (2013.01)

(58) Field of Classification Search
CPC .. G01R 33/07; G01R 33/077; G01R 33/075; G01D 5/145; G01D 5/142
USPC .......................................................... 324/251
See application file for complete search history.

(56) References Cited

U.S. PATENT DOCUMENTS

| 4,668,914 | A | 5/1987 | Kersten et al. |
|---|---|---|---|
| 4,761,569 | A | 8/1988 | Higgs |
| 4,829,352 | A | 5/1989 | Popovic et al. |
| 5,541,506 | A | 7/1996 | Kawakita et al. |
| 5,572,058 | A | 11/1996 | Biard |
| 5,612,618 | A | 3/1997 | Arakawa |
| 5,619,137 | A | 4/1997 | Vig et al. |

(Continued)

FOREIGN PATENT DOCUMENTS

| DE | 10 2005 014 509 B4 | 10/2006 |
|---|---|---|
| DE | 10 2006 037 226 A1 | 2/2008 |

(Continued)

OTHER PUBLICATIONS

Kaufmann et al.; "Novel Coupling Concept for Five-Contact Vertical Hall Devices;" IEEE 2011 16th International Solid-State Sensors, Actuators and Microsystems Conference (Transducers); Jun. 5-9, 2011; pp. 2855-2858, 4 pages.

(Continued)

*Primary Examiner* — Reena Aurora
(74) *Attorney, Agent, or Firm* — Daley, Crowley, Mofford & Durkee, LLP

(57) ABSTRACT

A magnetic field sensor with a plurality of magnetic field sensing elements is presented. The magnetic field sensor includes a sequences switches circuit to sequentially select from among the plurality of magnetic field signals. The magnetic field sensor further includes a memory device to store a plurality of potentiometer control values. Also included is a variable potentiometer to attenuate an offset of each one of the plurality of magnetic field signals by using a respective plurality of offset attenuation factors responsive to one or more of the plurality of potentiometer control values. A corresponding method is also described.

28 Claims, 9 Drawing Sheets

(56) References Cited

U.S. PATENT DOCUMENTS

| | | | |
|---|---|---|---|
| 5,621,319 | A | 4/1997 | Bilotti et al. |
| 5,657,189 | A | 8/1997 | Sandhu |
| 5,694,038 | A | 12/1997 | Moody et al. |
| 5,831,513 | A | 11/1998 | Lue |
| 5,844,411 | A | 12/1998 | Vogt |
| 5,942,895 | A | 8/1999 | Popovic et al. |
| 6,064,199 | A | 5/2000 | Walter et al. |
| 6,064,202 | A | 5/2000 | Steiner et al. |
| 6,091,239 | A | 7/2000 | Vig et al. |
| 6,100,680 | A | 8/2000 | Vig et al. |
| 6,166,535 | A | 12/2000 | Irle et al. |
| 6,232,768 | B1 | 5/2001 | Moody et al. |
| 6,236,199 | B1 | 5/2001 | Irle et al. |
| 6,265,864 | B1 | 7/2001 | De Winter et al. |
| 6,288,533 | B1 | 9/2001 | Haeberli et al. |
| 6,297,627 | B1 | 10/2001 | Towne et al. |
| 6,356,741 | B1 | 3/2002 | Bilotti et al. |
| 6,525,531 | B2 | 2/2003 | Forrest et al. |
| 6,542,068 | B1 | 4/2003 | Drapp et al. |
| 6,545,462 | B2 | 4/2003 | Schott et al. |
| 6,622,012 | B2 | 9/2003 | Bilotti et al. |
| 6,768,301 | B1 | 7/2004 | Hohe et al. |
| 6,969,988 | B2 | 11/2005 | Kakuta et al. |
| 7,030,606 | B2 | 4/2006 | Kato et al. |
| 7,038,448 | B2 | 5/2006 | Schott et al. |
| 7,085,119 | B2 | 8/2006 | Bilotti et al. |
| 7,119,538 | B2 | 10/2006 | Blossfeld |
| 7,159,556 | B2 | 1/2007 | Yoshihara |
| 7,235,968 | B2 | 6/2007 | Popovic et al. |
| 7,259,556 | B2 | 8/2007 | Popovic et al. |
| 7,307,824 | B2 | 12/2007 | Bilotti et al. |
| 7,362,094 | B2 | 4/2008 | Voisine et al. |
| 7,714,570 | B2 | 5/2010 | Thomas et al. |
| 7,746,065 | B2 | 6/2010 | Pastre et al. |
| 7,759,929 | B2 | 7/2010 | Forsyth |
| 7,872,322 | B2 | 1/2011 | Schott et al. |
| 7,911,203 | B2 | 3/2011 | Thomas et al. |
| 7,965,076 | B2 | 6/2011 | Schott |
| 7,994,774 | B2 | 8/2011 | Thomas et al. |
| 2006/0011999 | A1 | 1/2006 | Schott et al. |
| 2009/0121707 | A1 | 5/2009 | Schott |
| 2009/0174395 | A1 | 7/2009 | Thomas et al. |
| 2010/0156397 | A1 | 6/2010 | Yabusaki et al. |
| 2010/0164491 | A1 | 7/2010 | Kejik et al. |
| 2011/0248708 | A1 | 10/2011 | Thomas et al. |
| 2012/0313635 | A1* | 12/2012 | Daubert ............. G01R 33/077 324/251 |
| 2015/0253156 | A1* | 9/2015 | Petrie ................. G01D 5/145 324/207.2 |
| 2015/0316623 | A1* | 11/2015 | Romero ............. G01R 33/077 324/251 |

FOREIGN PATENT DOCUMENTS

| | | |
|---|---|---|
| EP | 0 631 416 B1 | 12/1994 |
| EP | 0 875 733 B1 | 11/1998 |
| EP | 0 916 074 B1 | 5/1999 |
| EP | 2 000 814 A2 | 12/2008 |
| JP | 58-055688 A | 4/1983 |
| JP | 2003-042709 | 2/2003 |
| JP | 2005-241269 | 9/2005 |
| JP | 2010-014607 | 1/2010 |
| JP | 2010-078366 | 4/2010 |
| WO | WO 98/10302 | 3/1998 |
| WO | WO 98/54547 | 12/1998 |
| WO | WO 00/02266 | 1/2000 |
| WO | WO 03/036732 A2 | 5/2003 |
| WO | WO 2004/025742 A1 | 3/2004 |
| WO | WO 2006/056829 A1 | 6/2006 |
| WO | WO 2006/074989 A2 | 7/2006 |
| WO | WO 2008 145662 A1 | 12/2008 |
| WO | WO 2009/124969 A1 | 10/2009 |

OTHER PUBLICATIONS

Data Sheet of Allegro Microsystems, LLC for A1331 "Precision, Micro Power Hall-Effect Angle Sensor IC With Integrated Turns Counter" Dec. 16, 2014; 21 pages.

Data Sheet of Allegro Microsystems, LLC for A1332 "Precision Hall Effect Angle Sensor IC With I$^2$C Interface" Dec. 4, 2014, 19 pages.

U.S. Appl. No. 14/551,905, filed Nov. 24, 2014; 70 pages, A magnetic field sensor with improved accuracy resulting from a variable potehtiometer and a gain circuit.

Allegro Microsystems, Inc.; "High Precision Linear Hall Effect Sensor IC with a Push/Pull, Pulse Width Modulated Output;"A1351; pp. 1-23.

Allegro Microsystems, Inc.; "High Precision 2-Wire Linear Hall-Effect Sensor IC with a Pulse Width Modulated Output;" A1354; pp. 1-22.

Allegro Microsystems, Inc.; "High-Precision Linear-Hall-Effect Sensor with an Open Drain Pulse Width Modulated Output;" A1356; pp. 1-20.

Allegro Microsystems, Inc.; "Low-Noise Programmable Linear Effect Sensor ICs with Adjustable Bandwidth (50 kHz Maximum) and Analog Output;" A1360, A1361, A1361 and A1362; pp. 1-25.

Baschirotto et al.; "Development and Analysis of a PCB Vector 2-D Magnetic Field Sensor System for Electronic Compasses;" IEEE Sensors Journal, vol. 6, No. 2; Apr. 2006; pp. 365-371.

Kejik, et al., "Purley CMOS Angular Position Sensor Based on a New Hall Microchip;" 34$^{th}$ Annual Conference of IEEE Industrial Electronics; IECON; Nov. 10-13, 2008; pp. 1777-1781.

Kejik,.et al.; "Ultra-Low-Power Angular Position Sensor for High-Speed Portable Applications;" 2009 IEEE Sensors Conference; Oct. 25-28, 2009; pp. 173-176.

Reymond, et al.; "True 2D CMOS Integrated Hall Sensor;" 2007 IEEE Sensors Conference; Oct. 28-31, 2007; pp. 860-863.

Gerhauser; "Intelligente 3D-Magnetfeld Snesorik;" Fraunhofer-Institut for Integrierte Schaltungen IIS; www.iis.fraunhofer.de/asic/analog; Oct. 2009; 2 pages.

Melexis Microelectronic Integrated Systems; MLX90333; "Triaxis 3D-Joystick Position Sensor;" Data Sheet; Mar. 2009; 43 pages.

MEMSIC Corporation; AN-00MM-004; "Electronic Tilt Compensation;" Mar. 2008; 5 pages.

MEMSIC Corporation; AN-00MM-003; "Magnetic Sensor Caiibration;" Mar. 2008; 5 pages.

MEMSIC Corporation; AN-00MM-002; "Magnetometer Soldering Methodology;" Jun. 2008; 2 pages.

MEMSIC Corporation; AN-00MM-001; "Magnetometer Fundamentals;" Jun. 2008; 6 pages.

MEMSIC Corporation; AN-00MM-005; "Magnetic Sensor Placement Guidelines;" Oct. 2008; 2 pages.

MEMSIC Corporation; MMC312x1Q; "Tri-axis Magnetic Sensor, with I$^2$C Interface;" Aug. 14, 2008; 9 pages.

MEMSIC Corporation; MMC14xMS; "Ultra Small 3-axis Magnetic Sensor, with I$^2$C Interface;" Mar. 31, 2010; 8 pages.

Micronas GmbH; "HAL® 3625 Programmable Direct Angle Sensor;" Product Information; Sep. 2009; 2 pages.

Allegro Microsystems, Inc.; "A1140/41/42/43 Data Sheet: Sensitive Two-Wire Chopper Stabilized Unipolar Hall-Effect Switched;" published Sep. 9, 2004; pp. 1-11.

Allegro Microsystems, Inc.; "A1174 Data Sheet: Ultrasensitive Hall Effect Latch with Internally or Externally Controlled Sample and Sleep Periods for Track Ball and Scroll Wheel Applications;" published Jul. 25, 2008; pp. 1-13.

Allegro Microsystems, Inc.; "A1230 Data Sheet: Ultra-Sensitive Dual-Channel Quadrature Hall-Effect Bipolar Switch;" published Mar. 26, 201; 16 sheets.

Allegro Microsystems, Inc.; "A1351 Data Sheet: High Precision Linear Hall Effect Sensor with a Push/Pull, Pulse Width Modulated Output;" published Mar. 7, 2008; pp. 1-23.

(56) References Cited

OTHER PUBLICATIONS

Allegro Microsystems, Inc.; "A1360, A1361 and A1362 Data Sheet: Low Noise Programmable Linear Hall Effect Sensors with Adjustable Bandwith (50 *kHz* Maximum) and Analog Output;" published Mar. 18, 2008; pp. 1-25.

Allegro Microsystems, Inc.; "A3212 Data Sheet; Micropower, Ultra-Sensitive Hall-Effect Switch;" published Sep. 22, 2004; pp. 1-12.

Allegro Microsystems, Inc.; "ATS675LSE Data Sheet: Self Calibrating TPOS Speed Sensor Optimized for Automotive Cam Sensing Applications;" published Jul. 11, 2008; pp. 1-13.

Allegro Microsystems, Inc.; "27701-AN Data Sheet: Hall-Effect IC Applications Guide;" Application Information, Rev. 2; http://www.allegromicro.com/en/products/design/hall-effect-sensor-ic-applications-guide/AN27701.pdf; downloaded Sep. 29, 2010; pp. 1-40.

Allegro Microsystems, Inc.; "3235 Data Sheet 27633A, Dual-Output Hall-Effect Switch;" http://www.datasheetcatalog.org/datasheets/90/205047_DS.pdf; downloaded Sep. 29, 2010; 6 sheets.

Allegro Microsystems, Inc.; "A3425 Data Sheet: Dual, Chopper-Stabilized, Ultra-Sensitive Bipolar Hall-Effect Switch;" published Jun. 28, 2002; pp. 1-10.

Atherton et al.; "Sensor Signal Conditioning—an IC Designer's Perspective;" IEEE Electro International; Apr. 26-28, 1991; pp. 129-134.

Austria Microsystems; "AS5040 datasheet; 10-Bit Programmable Magnetic Rotary Encoder," Revision 1.1; Jan. 2004; pp. 1-20.

Blanchard et al.; "Cylindrical Hall Device;" International Electron Devices Meeting; Dec. 8-11, 1996; pp. 541-544.

Burger et al.; "New fully integrated 3-D silicon Hall sensor for precise angular-position meseaurements;" Sensors and Actuators, A 67; May 1998; pp. 72-76.

Dwyer; Allegro Microsystems, Inc. ; "AN296061 Data Sheet: Ring Magnet Speed Sensing for Electronics Power Steering;" published Jul. 21, 2009; pp. 1-4.

Freitas et al.; "Giant magnetoresistive sensors for rotational speed control;" Journal of Applied Physics, vol. 85, No. 8; Apr. 15, 1999; pp. 5459-5461.

Gilbert; "Technical Advances in Hall-Effect Sensing;" Allegro Microsystems, Inc. Product Description; May 10, 2008; 7 sheets.

Häberil et al.; "Contactless Angle Measurements by CMOS Magnetic Sensor with On Chip Read-Out Circuit;" The 8th International Conference on Solid-State Sensors and Acutators and Eurosensors IX; Jan. 25-29, 1995; pp. 134-137.

Häberil et al.; "Two-Dimensional Magnetic Microsensor with On-Chip Signal Processing for Contactless Angle Measurement;" IEEE Journal of Solid-State Circuits, vol. 31, No. 12; Dec. 1996; pp. 1902-1907.

Hiligsmann et al.; "Monolithic 360 degrees Rotary Position Sensor IC;" 2004 IEEE Proceedings of Sensors, vol. 3; Oct. 24-27, 2004; pp. 1137-1142.

Kejik et al.; "Circular Hall Transducer for Angular Position Sensing;" International Solid-State Sensors, Actuators and Microsystems Conference; Transducers; Jun. 2007; pp. 2593-2596.

Lou Law; "Angle Position Sensing with 2-Axis Hall ICs;" Sensors Magazine, vol. 20, No. 3; Mar. 2003; 7 sheets.

Masson et al.; "Multiturn and high precision through-shaft magnetic sensors;" Sensor + Text Conference; Proceedings II; May 2009; pp. 41-46.

Metz et al.; "Contactless Angle Measurements Using Four Hall Devices on Single Chip;"; International Conference on Solid State Sensors and Actuators; Transducers; vol. 1; Jun. 16-19, 1997; pp. 385-388.

Munter; "A Low-offset Spinning-current Hall Plate;" Sensors and Acutators, vol. A21-A23; Jan. 1990; pp. 743-746.

Novotechnik Siedle Group; "How New Angular Positioning Sensor Technology Opens a Broad Range of New Applications;" Vert-X Technology; Dec. 2001; pp. 1-5.

Paranjape et al.; "A CMOS-compatible 2-D vertical Hall magnetic-field sensor using active carrier confinement and post-process micromatching;" The 8th International Conference on Solid-State Sensors and Actuators, Physical vol. 53, Issues 1-3; May 1996; pp. 278-283.

Petoussis et al.; "A Novel Hall Efect Sensor Using Elaborate Offset Cancellation Method;" Sensors & Transducers Journal, vol. 100, Issue 1; Jan. 2009; pp. 85-91.

Popovic; "Not-plate-like Hall magnetic sensors and their applications;" Sensors and Actuators A: Physical, vol. 85, Issues 1-3; Aug. 2000; pp. 9-17.

Roumenin et al.; "Vertical Hall Effect Devices in the Basis of Smart Silicon Sensors;" IEEE Workshop on Intelligent Data Acquisition and Advanced Computing Systems: Technology and Applications; Sep. 5-7, 2005; pp. 55-58.

Roumenin; "Magnetic sensors continue to advance towards perfection;" Sensors and Actuators A: Physical, vol. 46-47, Issues 1-3; Jan.-Feb. 1995; pp. 273-279.

Schneider et al.; "Temperature Calibration of CMOS Magnetic Vector Probe for Contactless Angle Measurement System;" International Electron Devices Meeting; Dec. 8-11, 1996; pp. 533-536.

SENSIMA technology sa; "CVHD: a new concept of Angular Position Sensor;" Slide Presentation for Allegro Microsystems; Mar. 2009; 17 sheets.

Sentron; AN-101; "Angular position sensing with 2-Axis Hall IC 2SA-10;" Feb. 14, 2004; http://www.diegm.uniud.it/petrella/Azionamenti%20Elettrici%20II/Sensori%20e%20trasduttori/Data%20Sheet%20-%202SA-10.pdf; pp. 1-7.

van der Meer; et al; "CMOS quad spinning-current Hail-sensor system for compass application;" IEEE Proceedings of Sensors, vol. 3; Oct. 24-27, 2004; pp. 1434-1437.

Vogeigesang et al; Robert Bosch GmbH; "GMR sensors in automotive application;"CS-SNS/ECS Slides Presentation; Mar. 2, 2005; 16 sheets.

Volder; "The CORDIC Trigonometric Computing Technique;" The Institute of Radio Engineers, Inc.; IRE Transactions on Electronic Computers, vol. EC, Issue 3; Sep. 1959; pp. 226-230.

Banjevic; "High Bandwidth CMOS Magnetic Sensors Based on the Miniaturized Circular Vertical Hall Device;" Sep. 2011; 153 pages.

Drljaca, et al.; "Nonlineat Effects in Magnetic Angular Position Sensor With Integrated Flux Concentrator;" Proc. 23rd International Conference on Microelectronics (MIEL 2002); vol. 1; NIS: Yugoslavia; May 12-15, 2002; pp. 223-226.

Melexis MLX 90324; ""Under-the-Hood" Triaxis Rotary Position feat. SENT Protocol;" 3901090324 Data Sheet; Dec. 2008; 40 pages.

Petrie; "Circular Vertical Hail Magnetic Field Sensing Element and Method with a Plurality of Continuous Output Signals;" U.S. Appl. No. 13/035,243, filed Feb. 25, 2011; 56 pages.

\* cited by examiner

MAGNETIC FIELD SENSOR WITH IMPROVED ACCURACY RESULTING FROM A DIGITAL POTENTIOMETER

CROSS REFERENCE TO RELATED APPLICATIONS

Not Applicable.

STATEMENT REGARDING FEDERALLY SPONSORED RESEARCH

Not Applicable.

FIELD OF THE DISCLOSURE

This disclosure relates generally to magnetic field sensors and, more particularly, to a magnetic field sensor that can provide an output signal with improved accuracy that is representative of an angle of rotation and a speed of rotation of a target object.

BACKGROUND OF THE DISCLOSURE

Magnetic field sensing elements can be used in a variety of applications. In one application, a magnetic field sensing element can be used to detect a direction of a magnetic field, i.e., and angle of the direction of the magnetic field. In another application, a magnetic field sensing element can be used to sense an electrical current. One type of current sensor uses a Hall Effect magnetic field sensing element in proximity to a current-carrying conductor.

Planar Hall elements and vertical Hall elements are known types of magnetic field sensing elements. A planar Hall element tends to be responsive to magnetic field perpendicular to a surface of a substrate on which the planar Hall element is formed. A vertical Hall element tends to be responsive to magnetic field parallel to a surface of a substrate on which the vertical Hall element is formed.

Other types of magnetic field sensing elements are known. For example, a so-called "circular vertical Hall" (CVH) sensing element, which includes a plurality of vertical Hall elements, is known and described in PCT Patent Application No. PCT/EP2008056517, entitled "Magnetic Field Sensor for Measuring Direction of a Magnetic Field in a Plane," filed May 28, 2008, and published in the English language as PCT Publication No. WO 2008/145662, which application and publication thereof are incorporated by reference herein in their entirety. The CVH sensing element is a circular arrangement of vertical Hall elements arranged over a common circular implant region in a substrate. The CVH sensing element can be used to sense a direction (i.e., an angle) (and optionally a strength) of a magnetic field in a plane of the substrate.

Various parameters characterize the performance of magnetic field sensing elements and magnetic field sensors that use magnetic field sensing elements. These parameters include sensitivity, which is a change in an output signal of a magnetic field sensing element in response to a change of magnetic field experienced by the magnetic sensing element, and linearity, which is a degree to which the output signal of the magnetic field sensing element varies in direct proportion to the magnetic field. These parameters also include an offset, which is characterized by an output signal from the magnetic field sensing element not representative of a zero magnetic field when the magnetic field sensing element experiences a zero magnetic field.

The above-described CVH sensing element is operable, with associated circuits, to provide an output signal representative of an angle of a direction of a magnetic field. Therefore, as described below, if a magnet is disposed upon or otherwise coupled to a so-called "target object," for example, a camshaft in an engine, the CVH sensing element can be used to provide an output signal representative of an angle of rotation of the target object.

The CVH sensing element provides output signals from a plurality of vertical Hall elements from which it is constructed. Each vertical Hall element can have an undesirable and different DC offset.

The CVH sensing element is but one sensing element that can provide an output signal representative of an angle of a magnetic field, i.e., an angle sensor. For example, an angle sensor can be provided from a plurality of separate vertical Hall elements or a plurality of magnetoresistance elements.

It would be desirable to reduce the DC offsets of a plurality of magnetic field sensing elements (e.g., vertical Hall elements of a CVH sensing element). It would be further desirable to provide an angle sensor with improved accuracy. It would be further desirable to reduce the effect of temperature upon the DC offsets and accuracy.

SUMMARY OF THE DISCLOSURE

The present disclosure is operable to reduce the DC offsets of a plurality of magnetic field sensing elements (e.g., vertical Hall elements of a CVH sensing element). It would be further desirable to provide an angle sensor with improved accuracy. The present disclosure is further operable to reduce the effect of temperature upon the DC offsets and accuracy.

In one aspect, a magnetic field sensor includes a plurality of magnetic field sensing elements with each of the plurality of magnetic field sensing elements having a respective plurality of contacts. The plurality of magnetic field sensing elements is configured to generate a plurality of magnetic field signals with each magnetic field signal responsive to a magnetic field. The magnetic field sensor further includes a sequences switches circuit coupled to the plurality of magnetic field sensing elements. The sequence switches circuit is coupled to receive a control signal and, in response to the control signal, the sequence switches circuit is configured to sequentially select from among the plurality of magnetic field sensing elements to generate a sequenced output signal representative of sequentially selected ones of the plurality of magnetic field signals. Additionally, the magnetic field sensor includes a memory device configured to store a plurality of potentiometer control values is the magnetic field sensor also includes a variable potentiometer coupled to the sequences switches circuit. The variable potentiometer is configured to attenuate an offset of each one of the plurality of magnetic field signals within the sequenced output signal by using a respective plurality of offset attenuation factors responsive to one or more of the plurality of potentiometer control values. Each one of the plurality of offset attenuation factors is related to a respective error voltage of a respective one of the plurality of magnetic field signals.

In another aspect, a method includes generating a plurality of magnetic field signals with a plurality of magnetic field sensing elements. Each one of the plurality of magnetic field sensing elements has a respective plurality of contacts with each magnetic field signal being responsive to a magnetic field. The method further includes sequentially selecting from among the plurality of magnetic field sensing elements, in response to a control signal, to generate a sequenced output signal representative of sequentially selected ones of the plurality of magnetic field signals. The method also includes storing, in a memory device, a plurality of potentiometer control values. Additionally, the method includes attenuating an offset of each one of the plurality of magnetic field signals within the sequenced output signal by using a respective to plurality of offset attenuation factors responsive to one or more of the plurality of potentiometer control values. Each one of the plurality of offset attenuation factors is related to a respective error voltage of a respective one of the plurality of magnetic field signals.

BRIEF DESCRIPTION OF THE DRAWINGS

The foregoing features of the disclosure, as well as the disclosure itself may be more carefully understood from the following detailed description of the drawings, which.

DETAILED DESCRIPTION

Figure 1:
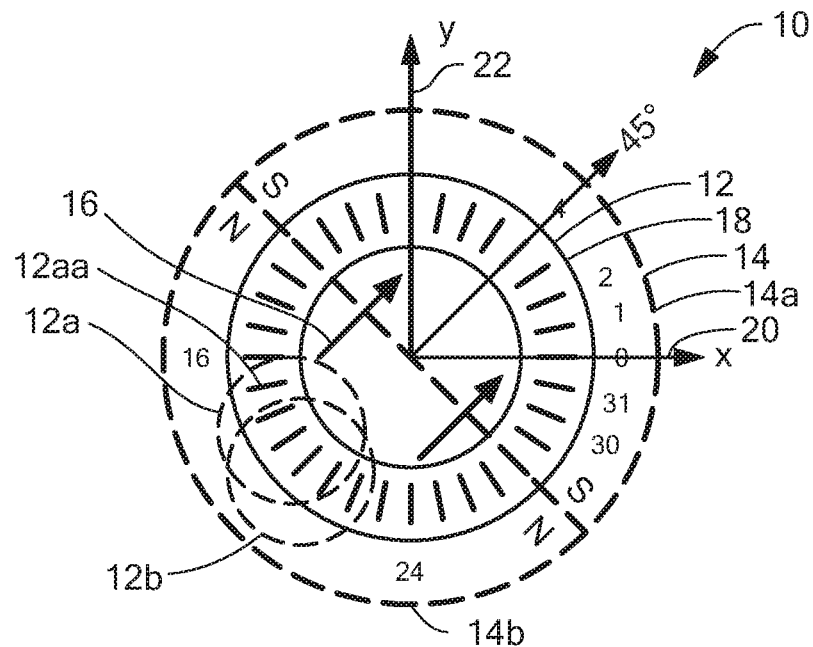
FIG. 1 is a pictorial showing a circular vertical Hall (CVH) sensing element having a plurality of vertical Hall elements arranged in a circle over a common implant region upon a substrate, and a two pole magnet disposed close to the CVH sensing element.

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an isotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type II-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital.

As used herein, the term "module" is used to describe a "processor."

A processor can contain internal processors or internal modules that perform portions of the function, operation, or sequence of operations of the processor. Similarly, a module can contain internal processors or internal modules that perform portions of the function, operation, or sequence of operations of the module.

While a circular vertical Hall (CVH) element, which has a plurality of vertical Hall elements, is described in examples below, it should be appreciated that the same or similar techniques and circuits apply to any type of magnetic field sensing element(s) arranged in a manner to detect an angle of a pointing direction of a magnetic field, i.e., a rotation angle of a target object to which a magnet is attached.

Referring to FIG. 1, a circular vertical Hall (CVH) element 12 includes a circular implant and diffusion region 18 in a substrate (not shown). The CVH sensing element 12 has a plurality of vertical Hall elements, of which a vertical Hall element 12a is but one example. In some embodiments, the common implant and diffusion region 18 can be characterized as a common epitaxial region upon a substrate, bounded by semiconductor isolation structures.

Each vertical Hall element has a plurality of Hall element contacts (e.g., four or five contacts), e.g., 12aa. Each vertical Hall element contact can be comprised of a metal contact over a contact diffusion region (a pickup) diffused into the common implant and diffusion region 18.

A particular vertical Hall element (e.g., 12a) within the CVH sensing element 12, which, for example, can have five adjacent contacts, can share some, for example, four, of the five contacts with a next vertical Hall element (e.g., 12b). Thus, a next vertical Hall element can be shifted by one contact from a prior vertical Hall element. For such shifts by one contact, it will be understood that the number of vertical Hall elements is equal to the number of vertical Hall element contacts, e.g., 32 or 64. However, it will also be understood that a next vertical Hall element can be shifted by more than one contact from the prior vertical Hall element, in which case, there are fewer vertical Hall elements than there are vertical Hall element contacts in the CVH sensing element.

As shown, a center of a vertical Hall element 0 can positioned along an x-axis 20 and a center of vertical Hall element 8 can be positioned along a y-axis 22. In the exemplary CVH sensing element 12, there are thirty-two vertical Hall elements and thirty-two vertical Hall element contacts. However, a CVH can have more than or fewer than thirty-two vertical Hall elements and more than or fewer than thirty-two vertical Hall element contacts.

In some applications, a circular magnet 14 having a north side 14b and a south side 14a can be disposed over the CVH 12. The circular magnet 14 tends to generate a magnetic field 16 having a direction from the north side 14b to the south side 14a, here shown to be pointed to a direction of about forty-five degrees relative to x-axis 20.

In some applications, the circular magnet 14 is mechanically coupled to a rotating target object, for example, an automobile steering shaft of an automobile camshaft, and is subject to rotation relative to the CVH sensing element 12. With this arrangement, the CVH sensing element 12, in combination with an electronic circuit described below, can generate a signal related to the angle of rotation of the magnet 14, i.e., an angle of rotation of the target object to which the magnet is coupled.

Figure 1A:
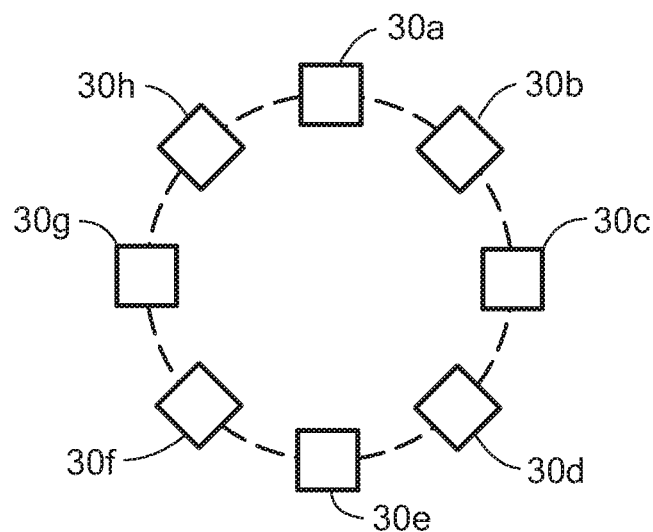
FIG. 1A is a pictorial showing a plurality of magnetic field sensing elements.

Referring now to FIG. 1A, a plurality of magnetic field sensing elements 30a-30h, in a general case, can be any type of magnetic field sensing elements. The magnetic field sensing elements 30a-30h can be, for example, separate vertical Hall elements or separate magnetoresistance elements, each having an axis of maximum response parallel to a surface of a substrate 34, each pointing in a different direction in the plane of the surface. These magnetic field sensing elements can be coupled to an electronic circuit in the same as or similar to electronic circuits described below in conjunction with FIGS. 3 and 6. There can also be a magnet the same as or similar to the magnet 14 of FIG. 1 disposed proximate to the magnetic field sensing elements 30a-30h.

Figure 2:
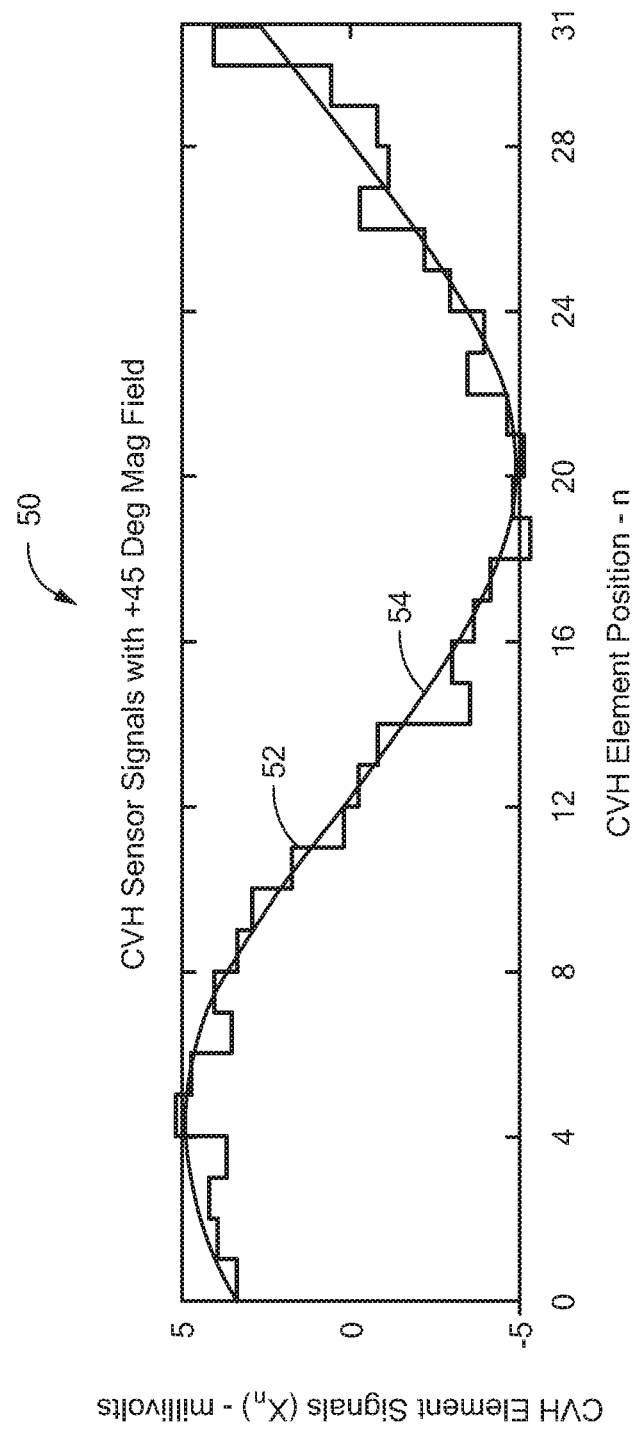
FIG. 2 is a graph showing an output signal as may be generated by the CVH sensing element of FIG. 1 or by the plurality of magnetic field sensing elements of FIG. 1A.

Referring now to FIG. 2, a graph 50 has a horizontal axis with a scale in units of CVH vertical Hall element position, n, around a CVH sensing element, for example, the CVH sensing element 12 of FIG. 1. The graph 50 also has a vertical axis with a scale in amplitude in units of millivolts. The vertical axis is representative of output signal levels from the plurality of vertical Hall elements of the CVH sensing element taken sequentially, one at a time, about the ring of contacts of the CVH sensing element.

The graph 50 includes a signal 52 representative of output signal levels from the plurality of vertical Hall elements of the CVH taken with the magnetic field of FIG. 1 pointing in a direction of forty-five degrees.

Referring briefly to FIG. 1, as described above, vertical Hall element 0 is centered along the x-axis 20 and vertical Hall element 8 is centered along the y-axis 22. In the exemplary CVH sensing element 12, there are thirty-two vertical Hall element contacts and a corresponding thirty-two vertical Hall elements, each vertical Hall element having a plurality of vertical Hall element contacts, for example, five contacts. In other embodiments, there are sixty-four vertical Hall element contacts and a corresponding sixty-four vertical Hall elements.

In FIG. 2, for the magnetic field 16 pointing at positive forty-five degrees, a maximum positive signal is achieved from a vertical Hall element centered at position 4, which is aligned with the magnetic field 16 of FIG. 1, such that a line drawn between the vertical Hall element contacts (e.g., five contacts) of the vertical Hall element at position 4 is perpendicular to the magnetic field. A maximum negative signal is achieved from a vertical Hall element centered at position 20, which is also aligned with the magnetic field 16 of FIG. 1, such that a line drawn between the vertical Hall element contacts (e.g., five contacts) of the vertical Hall element at position 20 is also perpendicular to the magnetic field.

A sine wave 54 is provided to more clearly show ideal behavior of the signal 52. The signal 52 has variations due to vertical Hall element offsets, which tend to cause corresponding variations of output signals causing them to be too high or too low relative to the sine wave 54, in accordance with offset errors for each element. The offset signal errors are undesirable.

Full operation of the CVH sensing element 12 of FIG. 1 and generation of the signal 52 of FIG. 2 are described in more detail in the above-described PCT Patent Application No. PCT/EP2008/056517, entitled "Magnetic Field Sensor for Measuring Direction of a Magnetic Field in a Plane," filed May 28, 2008, which is published in the English language as PCT Publication No. WO 2008/145662.

Groups of contacts of each vertical Hall element can be used in a chopped arrangement (also referred to herein as current spinning) to generate chopped output signals from each vertical Hall element. Thereafter, a new group of adjacent vertical Hall element contacts can be selected (i.e., a new vertical Hall element), which can be offset by one element from the prior group. The new group can be used in the chopped arrangement to generate another chopped output signal from the next group, and so on.

Each step of the signal 52 is representative of an unchopped output signal, i.e., from one respective group of vertical Hall element contacts, i.e., from one respective vertical Hall element. Thus, for a CVH sensing element having 32 vertical Hall elements taken sequentially, there are thirty-two steps in the signal 52 when current spinning is not used. However, for embodiments in which current spinning is used, each step of the signal 52 can be comprised of several sub-steps (not shown, e.g., four sub-steps), each sub-step indicative of a current spinning "phase."

Current spinning and current spinning phases are described more fully below in conjunction with FIGS. 4-4C.

It will be understood that a phase of the signal 52 is related to an angle of the magnetic field 16 of FIG. 1 relative to position zero of the CVH sensing element 12. It will also be understood that a peak amplitude of the signal 52 is generally representative of a strength of the magnetic field 16. Using electronic circuit techniques described above in PCT Patent Application No. PCT/EP2008/056517, or using other techniques described below, a phase of the signal 52 (e.g., a phase of the signal 54) can be found and can be used to identify the pointing direction of the magnetic field 16 of FIG. 1 relative to the CVH sensing element 12.

The signal 52 is referred to herein as a "sequenced signal" 52, which will be understood to be comprised of sequential ones of a plurality of magnetic field signals, each magnetic field signal generated by a respective one of a plurality of magnetic field sensing elements, e.g., the plurality of vertical Hall elements within a CVH sensing element.

Figure 3:
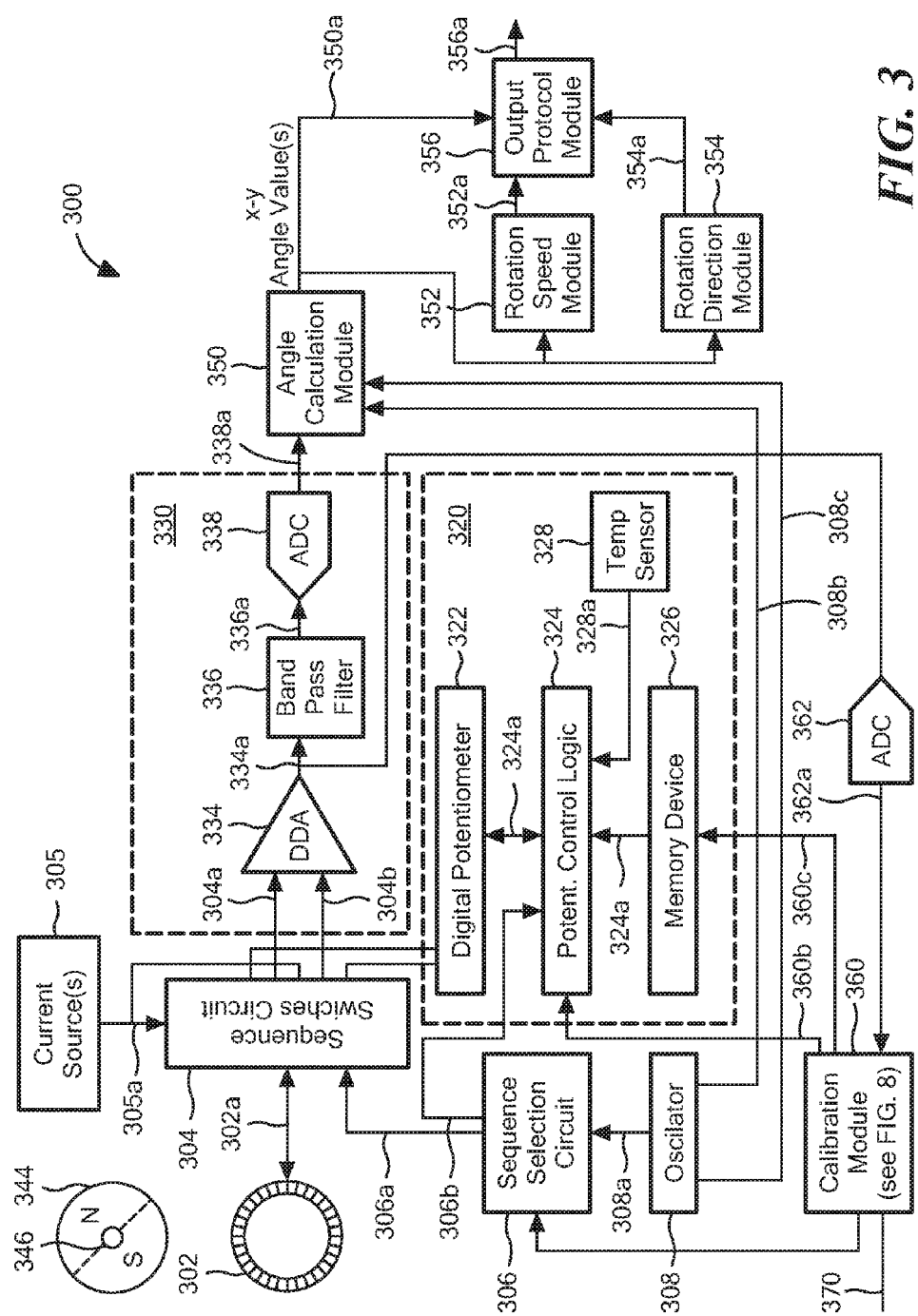
FIG. 3 is a block diagram of an exemplary magnetic field sensor having a CVH sensing element and a digital potentiometer circuit for offset cancellation that can improve an accuracy of the magnetic field sensor.

Referring now to FIG. 3, an exemplary magnetic field sensor 300 with improved accuracy is shown. The magnetic field sensor 300 includes a CVH sensing element 302 having a plurality of vertical Hall elements, with each vertical Hall element comprising a group of vertical Hall element contacts (e.g., five vertical Hall element contacts). In some embodiments, the CVH sensing element 302 can be the same as or similar to the CVH sensing element 12 described above in conjunction with FIG. 1, and in one aspect the CVH sensing element 302 can be disposed proximate to a two pole magnet 344 coupled to a target object 346, which magnet 344 can be the same as or similar to the magnet 14 of FIG. 1. However, in other embodiments, the CVH sensing element 302 can be replaced by a group of magnetic sensing elements that are the same as or similar to those described above in conjunction with FIG. 1A. The CVH sensing element 302 is configured to generate a plurality of magnetic field signals 302a, one at a time. Thus, the coupling at 302a can actually include a plurality of couplings to the plurality of vertical Hall elements within the CVH sensing element.

The CVH sensing element 302 can be coupled to a sequence switches circuit 304 that sequences through the vertical Hall elements of the CVH sensing element 302 to generate a differential sequenced signal 304a, 304b. The differential sequenced signal 304a, 304b can be the same as or similar to the sequenced signal 52 of FIG. 2.

The sequence switches circuit 304 can be coupled to a sequences selection circuit 306, which can be configured to generate a sequence control signal 306a. The sequence control signal 306a may, for example, control and/or indicate switching (or indexing) of the vertical Hall elements. The sequence selection module 306 can be coupled to an oscillator 308 and a potentiometer control logic circuit 324. The oscillator 308 can be configured to provide a clock signal 308a to the sequence selection circuit 306 for sequential selection of sequential ones of the plurality of vertical Hall elements of the CVH sensing element 302.

The sequence switches circuit 304 can additionally be coupled to a current source 305, which can be configured to generate one or more current signals 305a. The sequence switches circuit 304 can be configured to receive the one or more current signals 305a and to provide the current signals 305a to selected vertical Hall elements within the CVH sensing element 302.

The sequence switches circuit 304 can further be coupled to a potentiometer system 320. The potentiometer system 320 can comprise a digital potentiometer 322, which can be coupled to a potentiometer control logic circuit 324. The digital potentiometer 322 is described more fully below in conjunction with FIG. 7C. The potentiometer control logic circuit 324 can be coupled to a memory device 326. The digital potentiometer 322 can be further coupled to a temperature sensor 328. The digital potentiometer 322 can be configured to attenuate the offset of one or more of the magnetic field signals that are sequenced within the differential sequenced signal 304a, 304b, with or without current spinning, to produce the differential sequenced signal 304a, 304b as a differential sequenced output signal 304a, 304b that is sequentially attenuated by sequentially selected factor.

The potentiometer control logic circuit 324 can be coupled to receive a control signal 306b from the sequence selection circuit 306, the control signal 306b indicative of which one of the vertical Hall elements within the CVH sensing element 302 is currently being processed, and configured to adjust switches within the digital potentiometer 322 via the control signal 324a synchronously with the clock signal 308a and synchronously with changes of the control signal 306b, which can be synchronous with individual samples of the magnetic field signals within the differential sequenced signal 304a, 304b, i.e., synchronous with steps of the signal 52 of FIG. 2.

In some embodiments, the potentiometer control logic circuit 324 can also be coupled to receive a temperature signal 328a from the temperature sensor 328. In these embodiments, the potentiometer control logic circuit 324 can also adjust the switches within the digital potentiometer 322 in accordance with the temperature signal 328a.

The potentiometer control logic circuit 324 can be coupled to a memory device 326, which can be configured to store a plurality of potentiometer control values representative of a plurality of switch settings of the digital potentiometer 322. The plurality of switch settings of the digital potentiometer 322 can correspond to offset attenuations (i.e., offset attenuation factors) applied to the each of the magnetic field signals within the differential sequenced signal 304a, 304b, i.e., sequentially to each one of the vertical Hall elements within the CVH sensing element 302.

In some embodiments, the memory device 326 can store a plurality of values representative of the plurality switch setting of the digital potentiometer 322 for a plurality of different temperatures.

The memory device 326 can be coupled to receive and store one or more potentiometer control values 360c, and can be configured to supply the one or more stored potentiometer control values 326a to the potentiometer control logic circuit 324.

The potentiometer control logic 324 can be configured to select one or more stored potentiometer control values from the memory device 326 and can be configured to adjust the switch settings (i.e., offset attenuation factors) of the digital potentiometer 322 based upon the selected one or more correction coefficients.

It will be appreciated that the potentiometer control logic circuit 324 can make adjustments to the switch settings of the digital potentiometer 322 according to other characteristics of the magnetic field sensor 300.

The differential sequenced signal 304a, 304b and the potentiometer system 320 can be coupled to a signal processing system 330. The signal processing system 330 can be configured to receive and process the differential sequenced signal 304a, 304b, which has been sequentially attenuated by operation of the potentiometer system 320.

The signal processing system 330 can comprise a dual-input differential amplifier (DDA) 334, a band-pass filter 336, and an analog-to-digital converter (ADC) 338.

The DDA 338 can be coupled to receive the differential sequenced signal 304a, 304b and configured to generate an amplified signal 334a.

The bandpass filter 336 can be coupled to receive the amplified signal 334a and configured to generate a filtered signal 336a. The ADC 338 can be coupled to receive the filtered signal 336a and configured to generate a converted digital signal 338a.

The signal processing system 330, particularly the ADC 338 of the signal processing system 330, can be coupled to an angle calculation module 350. It is to be appreciated that the arrangement described above is only one of many potential configurations of the signal processing system 330.

The angle calculation module 350 can be coupled to receive the converted digital signal 330a and configured to generate an x-y angle signal 350a having x-y angle values indicative of the angle of the magnetic field generated by the magnet 344. In operation, the x-y angle signal 350a would have a larger angle error component were it not for operation of the potentiometer system 320. The angle error component is described more fully below in conjunction with FIG. 5. Let it suffice here to say that the angle error component is an angle error component that would otherwise cause the x-y angle signal 350a to not be perfectly representative of the true angle of the magnetic field generated by the magnet 344.

The angle calculation module 350 can be further coupled to receive clock signals 308b, 308c from the oscillator 308.

The magnetic field sensor 300 can further include a rotation speed module 352, a rotation direction module 354, and an output protocol module 356, each of which is coupled to receive the x-y angle signal 350a. It will be understood that the x-y angle signal 350a can change, and therefore, can be representative of a rotating magnetic field when the magnet 344 rotates.

The rotation speed module 352 can be configured to generate a rotation speed signal 352a indicative of a rotation speed of the magnet. The rotation direction module 354 can be configured to generate a direction signal 354a indicative of a rotation direction of the magnet 344.

The output protocol module 356 can be coupled to receive the x-y angle signal 350a, the rotation speed signal 352a, and the rotation direction signal 354a. The output protocol module 356 can be configured to generate an output signal 356a representative of one or more of the angle of the magnetic field generated by the magnet 344, representative of the speed of rotation of the magnet 344, or representative of the direction of rotation of the magnet 344. The output signal 356a can have in one of a variety of conventional formats, for example, an SPI format, a CAN format, an 12C format, or a Manchester format.

In some embodiments, the magnetic field sensor 300 can include a calibration module 360. The calibration module 360 can be coupled to receive a digital signal 362a from an analog to digital converter (ADC) 362. The ADC 262 can be coupled to receive the amplified signal 334a. The calibration module 360 can be configured to generate a calibration sequence clock signal 360a received by the sequence module 306, a potentiometer control signal 360b received by the potentiometer control logic circuit 324. The calibration module 360 can also be configured to generate the one or more potentiometer control values 360c that are used in normal operation.

The calibration module 360 can be coupled to receive a calibration control signal 370 received from outside to the magnetic field sensor 300. The calibration control signal 370 can operate to place the magnetic field sensor 300 into a calibration mode of operation.

Operation of the calibration module 360 is described more fully below in conjunction with FIG. 8. However, let it suffice here to say that the calibration module can identify a best setting (i.e., offset attenuation factors) of the digital potentiometer 322 for each one of the vertical Hall elements within the CVH sensing element 302, and can store those best offset attenuation factors 360c.

In some other embodiments, the calibration module 360 is outside of the magnetic field sensor 300, and the signals into and out of the calibration module 360 extend outside of the magnetic field sensor 300.

In operation, the digital potentiometer 322 of the digital potentiometer system 320 can act as an attenuator for the differential sequenced signal 304a, 304b of the sequences switches circuit 304 to reduce or equilibrate the offset of each CVH sensing element 302. The digital potentiometer system 320 may also be used for correcting error fluctuations in the transfer characteristic of the magnetic field sensor 300 due to factors such as temperature, ageing, mechanical stress, and voltage offset.

In operation, the potentiometer control logic 324 can be configured to sequentially adjust the offset of the differential sequenced signal 304a, 304b for each one of the steps of the differential sequenced signal 304a, 304b by setting switches of the digital potentiometer 322. The attenuations can be applied to the differential sequenced signal 304a, 304b to reduce the offset error of the CVH sensing element 302. In the case of an 8-bit digital potentiometer, for example, two hundred fifty five different selections of attention may be applied to the differential sequenced signal 304a, 304b. Adjustment of the attenuations can cause the voltage output of each vertical Hall element within the CVH sensing element 302 to change accordingly, resulting in a smaller difference between offsets associated with the plurality of vertical Hall elements within the CVH sensing element 302.

When using a digital potentiometer 322 with four control bits, for example, an offset difference reduction of approximately 10 to 12 times can be achieved. By adding a fine adjustment with 4 more bits, a total offset difference reduction of over 100 times is possible. The offset difference reduction achieved can be dependent on the number of control bits, i.e., the number of switches Sw1-SwN, of the digital potentiometer 322.

In some other embodiments, the attenuations applied to the differential sequenced signal 304a, 304b can be dynamically selected by an algorithm within the potentiometer control logic circuit 324, which can monitor the differential sequenced signal 304a, 304b by means of an analog-to-digital converter (not shown), for example. The algorithm may receive an input representative of the differential sequence signal 304a, 304b and set the attenuation in proportion to that input.

In operation, the potentiometer control logic 324 may receive a clock signal 306b from the oscillator 306 of FIG. 3. The clock signal 306b may, for example, indicate a change in the selection of the CVH sensing element by the sequence selection module 304.

In operation, the memory device 326 may store values representative of switch settings of the digital potentiometer 322. The potentiometer control logic can read the stored values (i.e., stored potentiometer control values) from the memory device 326. The memory device 326 can be electrically erasable programmable read-only memory (EE-PROM), or the like. The switch setting values (potentiometer control values) stored in the memory device 326 may be selectively and sequentially read by the potentiometer control logic circuit 324 to adjust the digital potentiometer 322 to desired states. At each switching (or indexing) of the vertical Hall elements within the CVH sensing element 302, a respective potentiometer control value can be loaded by the potentiometer control logic circuit 324 into the digital potentiometer 322 from the memory device 326.

In some embodiments, the potentiometer control logic circuit 324 can comprise other non-transitory, removable/non-removable, volatile/non-volatile computer memory devices to store software instructions for adjusting the digital potentiometer 322 in accordance with the above described methods.

The potentiometer control logic 324 can receive the temperature signal 328a from the temperature sensor 328 to compensate for temperature variations experienced by the magnetic field sensor 300. The temperature sensor 328 is preferably integrated on the magnetic field sensor 300 and is operable to send the temperature signal 328a representative of a temperature of the environment to the potentiometer control logic circuit 324 which, in turn, is operable to modify the switch settings of the digital potentiometer 322 in response to temperature variations. To this end, the memory device can receive potentiometer control values 340a associated with different temperatures, and the potentiometer control logic circuit can select stored potentiometer control values 326a according to the temperature signal 328a.

In operation, the temperature can be continuously detected by the temperature sensor 328. Dynamic sensing by the temperature sensor 300 and providing the temperature signal 328a to the potentiometer control logic circuit 324 provides for magnetic field sensing that is adaptive to temperature variations resulting from the magnetic field sensor 300 experiencing different temperatures.

Temperature compensation of the magnetic field sensor 300 can also be accomplished by using a temperature-dependent digital potentiometer that is controlled through the use of an internal digital look-up table, for example. Other well known means of temperature compensation such as using the temperature-dependent junction voltages of diodes, temperature-dependent resistors, or a digital microprocessor are also available.

The magnetic field sensor 300 can also be encased by a heat insulating structure such that the temperature of the magnetic field sensor 300 remains substantially constant and independent of the external environment.

In operation, the angle calculation module 350 compares a relative phase of the converted digital signal 330a and one of the clock signals 308b, 308c.

The x-y angle signal 350a can be calculated through analysis of zero-crossings of the converted digital signal 330a received from the ADC 338.

It is to be appreciated that the potentiometer system 320 of FIG. 3 has been described as being comprised of units (e.g., the digital potentiometer 322, the potentiometer control logic 324, and the memory device 326). It should be appreciated, however, that this is merely a functional description and that software, hardware, or a combination of software and hardware can perform the respective functions of the potentiometer system 320 in an equivalent manner. The potentiometer control logic, for example, can be software, hardware, or a combination of software and hardware.

Additional aspects of the exemplary magnetic field sensor 300, with particular focus on the potentiometer control system 320, are described in greater detail below in conjunction with FIGS. 5-8.

Figure 4:
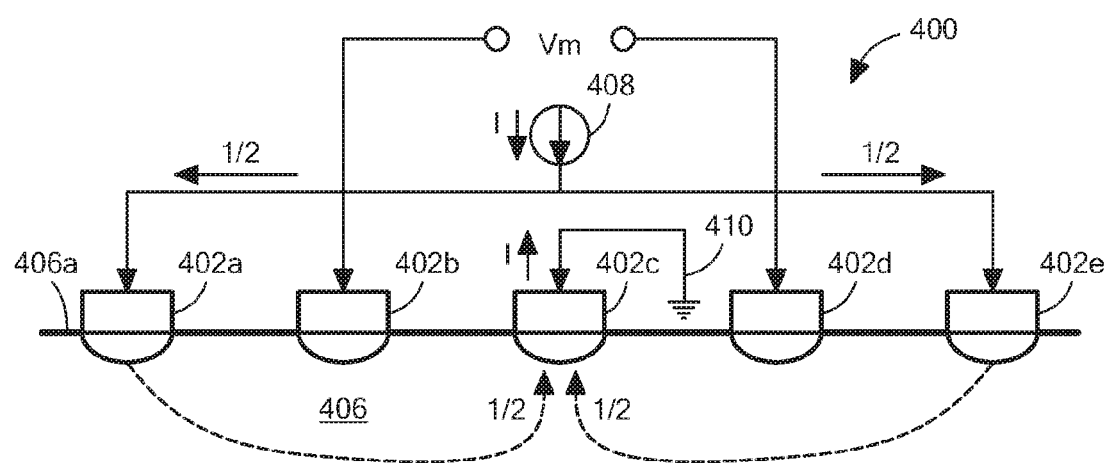
FIGS. 4-4C are side views of exemplary vertical Hall elements of the CVH sensing element of FIG. 3 when coupled into four current spinning phases, each phase associated with operation of one of the vertical Hall elements of the CVH sensing element of FIG. 3.
Figure 4A:
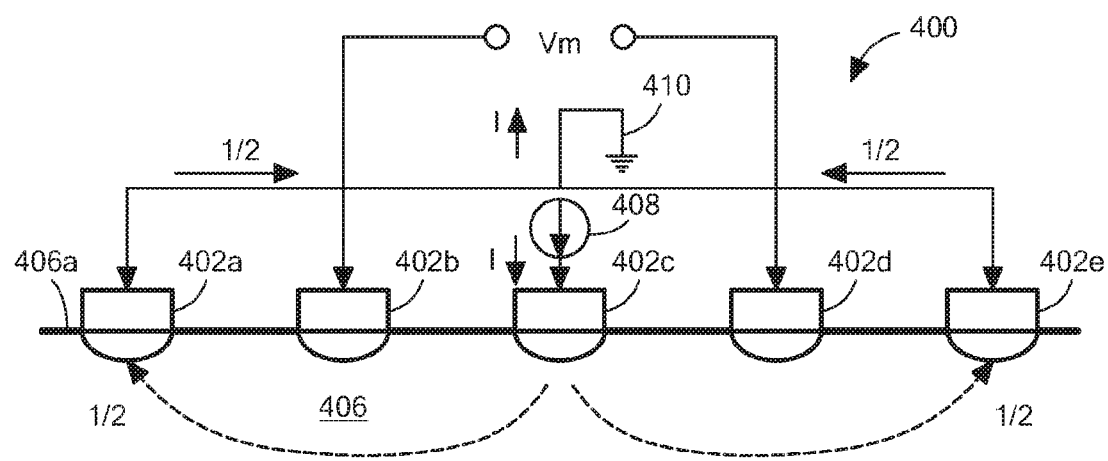
Figure 4B:
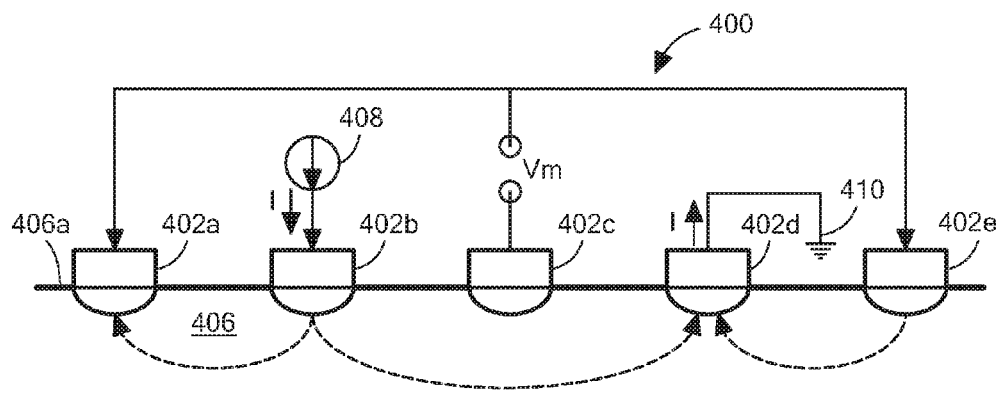
Figure 4C:
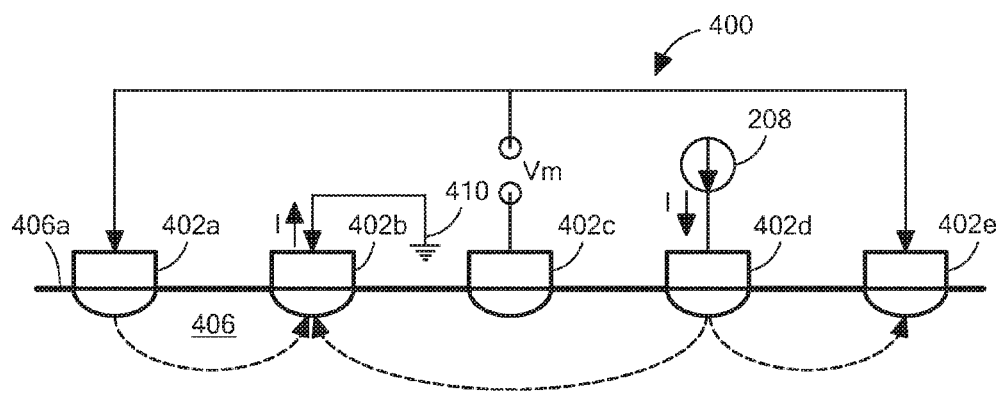

FIGS. 4-4C are representative of a four phase current spinning or chopping that can be used for any vertical Hall element having five contacts. Thus, it should be appreciated that such current spinning can be used for each selected vertical Hall element within the CVH sensing element 12 of FIG. 1 and the CVH sensing element 302 of FIG. 3. It should also be appreciated that such current spinning can also be used for separate magnetic field sensing elements, for example, the magnetic field sensing elements 30a-30h of FIG. 1A, where the magnetic field sensing elements 30a-30h are selected and chopped one of the time.

Referring now to FIG. 4, a vertical Hall element 400 is comprised of five vertical Hall element contacts, namely, first, second, third, fourth, and fifth vertical Hall element contacts, 402a, 402b, 402c, 402d, 402e, respectively. In a first chopping or current spinning phase, a current source 408, which can be the same as or similar to the current sources 305 of FIG. 3, can be coupled to the first and fifth vertical Hall element contacts 402a, 402e, respectively, which are coupled together, and can provide a total current of I, half of the current, I/2, flowing to the first vertical a Hall element contact 402a and half of the current, I/2, flowing to the fifth vertical Hall element contact 402e. The third vertical Hall element contact 402c is coupled to a voltage reference 410, for example, ground. Currents from the current source 408 flow from the first and fifth vertical Hall element contacts 402a, 402e, respectively, through a substrate 406 (e.g., through an epitaxial layer upon a substrate) of the vertical Hall element 400 to the third vertical Hall element contact 402c, as represented by dashed lines.

A signal, Vm, responsive to an external magnetic field, results between the second and fourth vertical Hall element contacts 402b, 402d, respectively. Thus, in the first current spinning phase, current spinning switches can select the second and fourth vertical Hall element contacts 402b, 402d to provide an output signal, and can select the first, fifth, and third vertical Hall element contacts 402a, 402e, 402c, respectively, as those contacts coupled to the current sources 305 of FIG. 3. Couplings during other current spinning phases described below will be apparent.

Referring now to FIG. 4A, in which like elements of FIG. 4 are shown having like reference designations, in a second current spinning phase of the same vertical Hall element 400 (same five vertical Hall element contacts), couplings are changed by current spinning switches. In the second phase, the current source 408 is coupled to the third vertical Hall element contact 402c, and the first and fifth vertical Hal element contacts 402a, 402e, respectively, are coupled together and to the reference voltage 410. Thus, the currents flow through the substrate 406 in opposite directions from those shown in FIG. 4.

As in FIG. 4, a signal, Vm, responsive to an external magnetic field, results between the second and fourth vertical Hall element contacts, 402b, 402d, respectively. The signal, Vm, of FIG. 4A is like the signal, Vm, of FIG. 4. However, the offset voltage within the signals can be different, e.g., different in sign.

Referring now to FIG. 4B, in which like elements of FIGS. 4 and 4A are shown having like reference designations, in a third current spinning phase upon the same vertical Hall element 400 (same five vertical Hall element contacts), couplings are again changed by current spinning switches. In the third phase, the current source 408 is coupled to the second vertical Hall element contact 402b, and the fourth vertical Hall element contact 402d is coupled to the reference voltage 410. Thus, a current flows from the second vertical Hall element contact 402b through the substrate 406 to the fourth vertical Hall element contact 402d.

The first and fifth vertical Hall element contacts 402a, 402e, respectively, are coupled together. Some current also flows from the second vertical Hall element contact 402b through the substrate 406 to the first vertical Hall element contact 402a and through the mutual coupling to the fifth vertical Hall element contact 402e. Some current also flows from the fifth vertical Hall element contact 402e through the substrate 406 to the fourth vertical Hall element contact 402d.

A signal, Vm, responsive to an external magnetic field, results between the first vertical Hall element contact 402a first (and the fifth vertical Hall element contact 402e) and the third vertical Hall element contact 402c. The signal, Vm, of FIG. 4B is like the signal, Vm, of FIGS. 4 and 4A. However, the offset voltage within the signal can be different.

Referring now to FIG. 4C, in which like elements of FIGS. 4-4B are shown having like reference designations, in a fourth chopping phase upon the same vertical Hall element 400 (same five vertical Hall element contacts), couplings are again changed by current spinning switches. In the fourth phase, the current is reversed from that shown in FIG. 4B. The current source 408 is coupled to the fourth vertical Hall element contact 402d, and the second vertical Hall element contact 402b is coupled to the reference voltage 410. Thus, a current flows from the fourth vertical Hall element contact 402d through the substrate 406 to the second vertical Hall element contact 402b.

The first and fifth vertical Hall element contacts 402a, 402e, respectively, are coupled together. Some current also flows from the fourth vertical Hall element contact 402d through the substrate 406 to the fifth vertical Hall element contact 402e, through the mutual coupling to the first vertical Hall element contact 402a. Some current also flows from the first vertical Hall element contact 402a through the substrate 406 to the second vertical Hall element contact 402b.

A signal, Vm, responsive to an external magnetic field, results between the first vertical Hall element contact 402a (and the fifth vertical Hall element contact 402e) and the third vertical Hall element contact 402c. The signal, Vm, of FIG. 4C is like the signal, Vm, of FIGS. 4-4B. However, the offset voltage within the signal can be different.

The signals, Vm, provided by the four phases of chopping of FIGS. 4-4C are responsive to an external magnetic field.

As described above, after generating the four current spinning phases on any one vertical Hall element within the CVH sensing element 402, by sequencing operation of the sequence switches circuit 304 of FIG. 3, the current spinning arrangements of FIGS. 4-4C can move to a next vertical Hall element, e.g., five vertical Hall element contacts offset by one vertical Hall element contact from those shown in FIGS. 4-4C, and the four current spinning phases can be performed on the new vertical Hall element by operation of current spinning switches.

While four current spinning phases are described above, it will become apparent from discussion below in conjunction with FIGS. 7A and 7B that only one phase, i.e., the couplings of FIG. 4A are used in the magnetic field sensor 300 of FIG. 3. Thus, current spinning is not used in embodiments herein.

Figure 5:
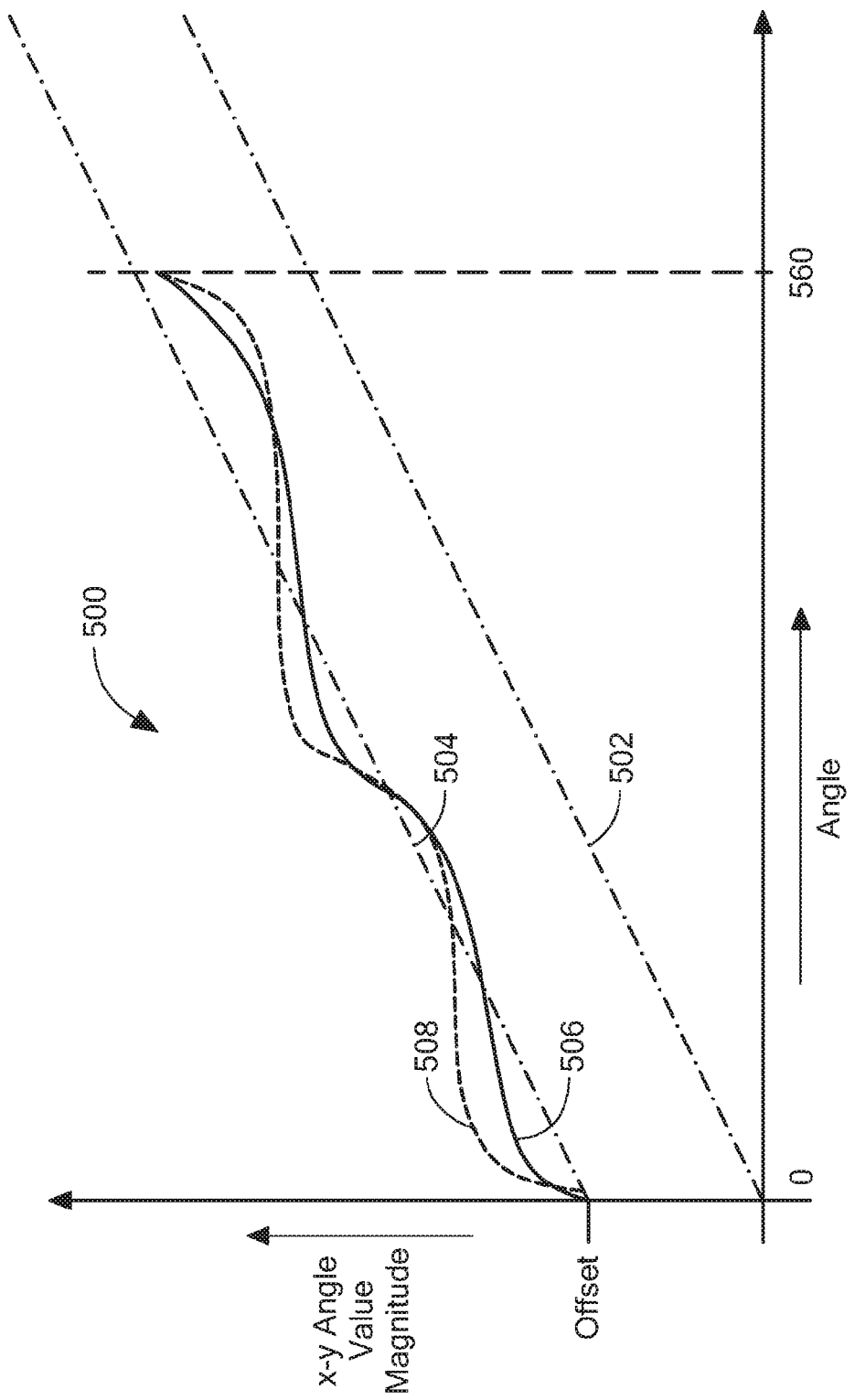
FIG. 5 is a graph showing ideal and non-ideal operation of the magnetic field sensor of FIG. 3.

Referring now to FIG. 5, a graph 500 has a horizontal axis with a scale in units of angular degrees and a vertical axis with a scale in units of value of an x-y angle value magnitude, for example, a magnitude of the x-y angle signal 350a of FIG. 3.

A line 502 is representative of an x-y angle value that has no angle error. When the x-y angle value has no angle error, the x-y angle value is perfectly linear with respect to actual angle, i.e., the x-y angle value is a perfect and true representation of the angle of the magnetic field generated by the magnet 344 of FIG. 3, and the line 502 passes through zero.

A line 504 is representative of an x-y angle value that has only an average or DC angle error, such that all angles represented by the x-y angle value are offset by a fixed number of degrees. The line 504 does not pass through zero.

A curve 506 is representative of an x-y angle value that has errors in representation of the true angle of the magnetic field generated by the magnet 344, average or DC errors and also an error that has a sinusoidal appearance.

A curve 508 is representative of an x-y angle value that has other errors in representation of the true angle of the magnetic field generated by the magnet 344.

A variety of circuit characteristics of the magnetic field sensor 100 contribute to the errors, i.e., to both the DC (or average) angle error represented by the curves 506, 508, and to the sinusoidal shapes of the curves 506, 508. One factor that contributes to the errors is switching noise generated by the sequence switches 304 of FIG. 3.

First, regarding the sequence switches circuit 304, it will be understood that charge injection or switching spikes (together referred to as noise) generated by the sequence switches 104 are not necessarily exactly the same as each sequential vertical Hall element is selected in the CVH sensing element 302. When the noise generated by the sequence switches 304 is not the same as each vertical Hall element is selected, a DC (or average) angle error is generated and also a sinusoidal type error such as that represented by the curves 506, 508. The sinusoidal error characteristic can be, in part, a result of the noise generated by the sequence switches being repetitive for each cycle around the CVH sensing element 302, and thus, the noise will have an angle error frequency component at a frequency of the signal 52 of FIG. 2, and will add to the signal 52 (350a of FIG. 3). The angle error frequency component is essentially fixed in phase relative the signal 350a, and therefore, the addition of the angle error causes different phase shift errors in the summed signal depending on the phase of the signal 350a. Higher harmonics can also result from the noise.

Other circuit characteristics can also contribute to the angle errors, i.e., to both the DC (or average) angle error represented by the error curves 506, 508, and to the sinusoidal shapes of the error curves 506, 508. Namely, a speed with which the dual differential amplifier 334 of FIG. 3, and also other circuit elements of FIG. 3, are unable to settle to final values as the sequence switches circuit 304 switches among the vertical Hall elements of the CVH sensing element 302 contributes to the errors.

The above-described circuit characteristics, including, but not limited to, switching noise and lack of circuit elements settling to final values, tend to be influenced by (i.e., changed by) a variety factors including, but not limited to, temperature of the magnetic field sensor 300 of FIG. 3, rate of sequencing around the CVH sensing element 302, and peak magnitude of the magnetic field experience by the CVH sensing element 302 as the magnet 344 rotates.

Differences between the curves 506, 508 can be attributed to changes in the same factors, namely, changes in the temperature, changes in or differences in peak amplitude of the magnetic field experience by the CVH sensing element 302 as the magnet 344 rotates, and changes in or differences in rates of sequencing around the CVH sensing element 302. Among these factors, it will be understood that the changes in the temperature can occur at any time. The changes in the peak amplitude of the magnetic field can be influenced by positional changes, i.e., air gap changes, between the magnet 344 and the CVH sensing element 302 of FIG. 3. The changes in the peak amplitude of the magnetic field can also be influenced by mechanical considerations, for example, wear of a bearing or the shaft 346 upon which the magnet 344 rotates. However, the sequencing rates can be fixed, and changed only for different applications of the magnetic field sensor 300.

In general, it has been determined that the dominant angle error frequency components occur at first and second harmonics of the frequency of the signal 52 (i.e., 304a, 304b). The curves 506, 508 are representative of angle error functions dominated by first and second harmonics of the frequency of the signal 52 (304a, 304b).

The potentiometer system of FIG. 3 is configured to equalize offsets among the vertical Hall elements within the CVH sensing element 302, resulting in smaller error components.

As temperature varies, each harmonic component of the angle error represented by curves 506, 508 can change independently in amplitude and phase.

Figure 6:
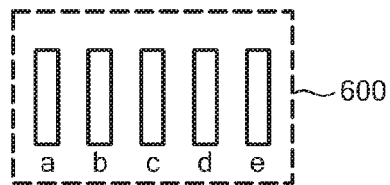
FIG. 6 is a block diagram showing contacts of one of the vertical Hall elements within the CVH sensing element of FIG. 3.

Referring now to FIG. 6, a vertical Hall element 600 can be representative of one of the vertical Hall elements within the CVH sensing element 302 of FIG. 3. As described above, each vertical Hall element within the CVH sensing element 302 of FIG. 3 comprises a group of vertical Hall element contacts (e.g., five vertical Hall element contacts), here labeled a-e with the labels comparable in other figures below.

Figure 7A:
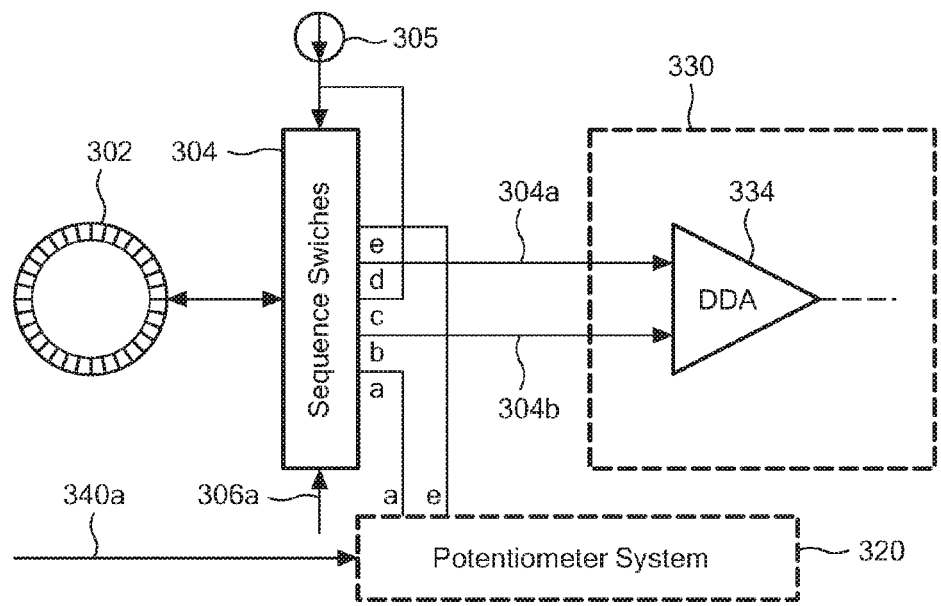
FIG. 7A is a block diagram showing a circuit for attenuating output signals of the sequence switches circuit, i.e., output signals from the CVH sensing element of FIG. 3.

Referring now to FIG. 7A, in which like elements of FIG. 3 are shown having like reference designations, the CVH sensing element 302 is coupled to the sequence switches circuit 304 is illustrated with the vertical Hall element contacts A-e of FIG. 6 explicitly shown.

Figure 7B:
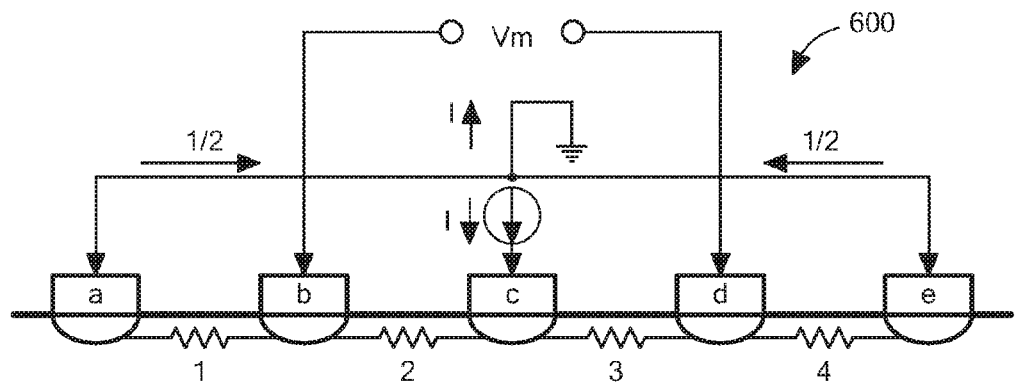
FIG. 7B is a side view of the vertical Hall element of FIG. 4A showing bulk resistance that exists between the element contacts.

Referring now to FIG. 7B, in which like elements of FIG. 6 are shown having like reference designations, the vertical Hall element 600 is shown to be fixed in the phase of FIG. 4A and has the same five vertical Hall element contacts labeled here as a-e as in FIG. 6. Resistors, 1, 2, 3, and 4 are shown between each adjacent pair of vertical Hall element contacts a-b, b-c, c-d, d-e, respectively. The resistors 1, 2, 3, and 4 correspond to the bulk resistance of a substrate, which may arise due to the inherent properties of the substrate over which the vertical Hall element contacts are formed. As is known, the bulk resistance of the substrate may vary based upon a wide variety of factors including the composition of the substrate material and the temperature thereof.

Figure 7C:
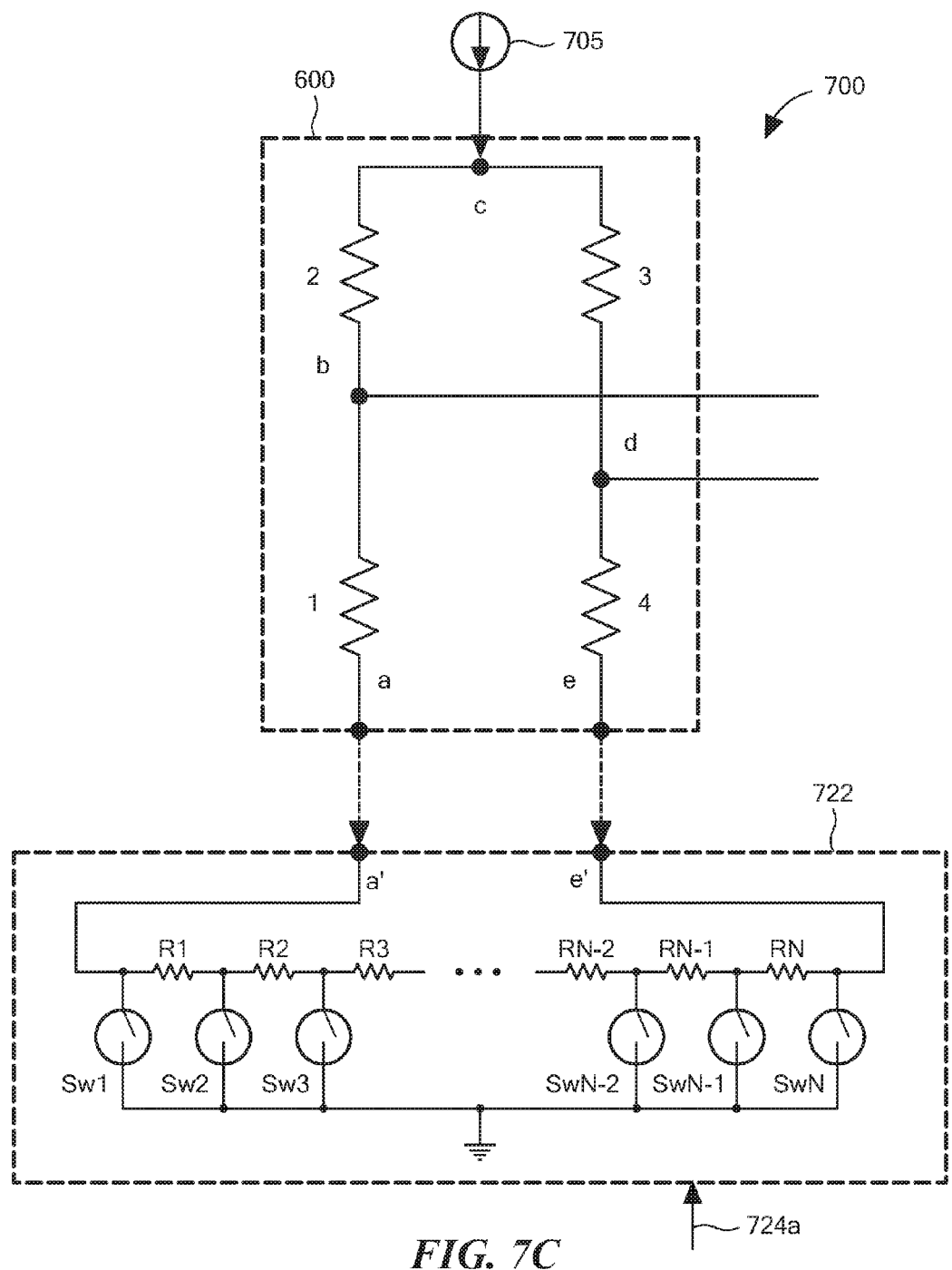
FIG. 7C is a schematic showing an equivalent circuit of the vertical Hall element of FIG. 7B coupled to the digital potentiometer circuit of FIG. 3.

Referring now to FIG. 7C, in which like elements of FIG. 6 are shown having like reference designations, an equivalent circuit 700 is shown which is representative of the vertical Hall element 600 of FIGS. 6 and 7A in the fixed coupling arrangement of FIG. 7A and is coupled to digital potentiometer 722, which can be the same as or similar to the digital potentiometer 322 of FIG. 3. As illustrated in FIG. 7C and as described above with respect the FIGS. 7A and 7B, resistors 1, 2, 3, and 4 of FIG. 7B are arranged between vertical Hall element contacts a, b, c, d, and e. The resistors include a first resistive element 1 connected between contacts a and b, a second resistive element 2 connected between contacts b and c, a third resistive element 3 connected between contacts c and d, and a fourth resistive element 4 connected between contacts e and d. An output comprising contacts b and d is coupled to both the digital potentiometer 722 as shown, and also to a DDA, for example, the DDA 334 of FIG. 3. The resistors 1-4 (i.e., a vertical Hall element within the CVH sensing element 302 of FIGS. 3 and 7) are driven by one or more current sources 705, which is coupled to the vertical Hall element contact c.

The digital potentiometer 722 comprises a plurality of switches (Sw1, Sw2 . . . SwN) for controlling the digital potentiometer 722. As described above in conjunction with FIG. 3, the plurality of switches (Sw1, Sw2 . . . SwN), i.e., switches within the digital potentiometer 322 of FIG. 3, is controlled by the potentiometer control logic circuit 324. Also within the digital potentiometer 322 of FIG. 3, the plurality of switches is coupled to a resistor network R1-RN. In operation, different settings of the switches (Sw1, Sw2 . . . SwN) provide dynamic scaling of signals within the differential sequenced signal 304a, 304b for corresponding ones of the vertical Hall elements within the CVH sensing element 302 of FIG. 3 as the vertical Hall elements are sequentially selected.

Values of the resistors (R1, R2 . . . RN) of the digital potentiometer 722 may be selected according to the resistances 1-4 of the selected vertical Hall element 600. Additionally it will be appreciated that the digital potentiometer 722 may include resistance value selection dependent on other resistance external to the digital potentiometer 722. The other resistance may correspond to resistance from a variety of different sources including, but not limited to power supply traces (or connections) that connect components (e.g., resistors, inductors, capacitors) to the magnetic field sensor 300.

In some embodiments, temperature coefficients of resistive elements 1, 2, 3, 4 are substantially the same as those of resistors (R1, R2 . . . RN) of the digital potentiometer 722. Keeping the temperature coefficients substantially the same allows for the various offset voltages of the vertical Hall elements within the CVH sensing element 302 of FIG. 3 to stay relatively unchanging over a temperature range, thereby reducing the temperature drift of the angle reading represented by the x-y angle signal (350a, FIG. 3).

It is to be appreciated that the circuit of FIG. 7C is provided as a non-limiting example and other equivalent circuits can be used to represent the same function.

Figure 8:
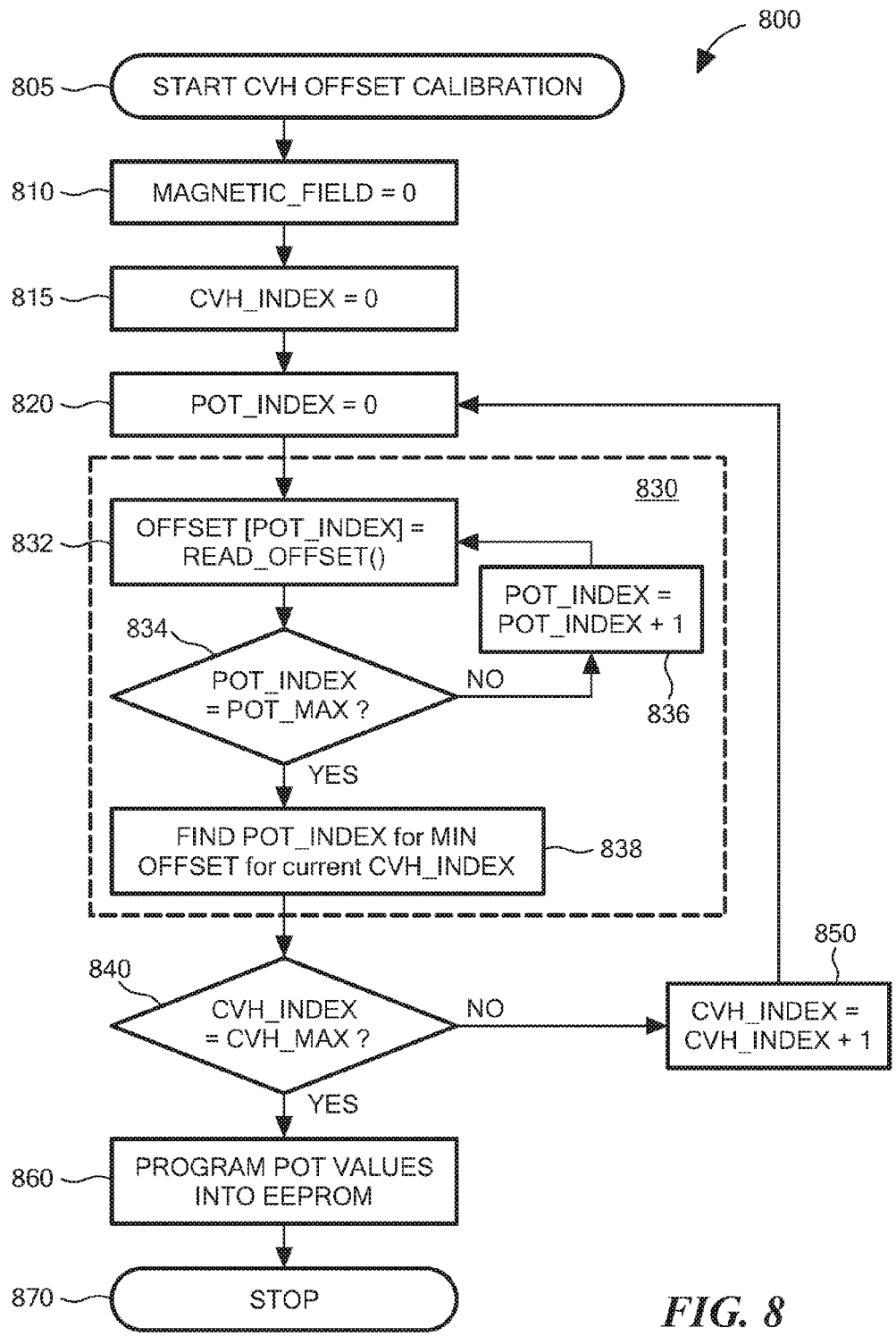
FIG. 8 is a flowchart illustrating an example CVH offset calibration method that may be applied to the magnetic field sensor of FIG. 3 for providing a magnetic field sensor with reduced offset.

Referring now to FIG. 8, shown is a flowchart corresponding to a CVH offset calibration method that can be implemented in magnetic field sensor 300 shown in FIG. 3, for example, and, more particularly, by way of a calibration module (e.g., 360 of FIG. 3). Rectangular elements (typified by element 810 in FIG. 8), herein denoted "processing blocks," represent computer software instructions or groups of instructions. Diamond shaped elements (typified by element 834 in FIG. 8), herein denoted "decision blocks," represent computer software instructions, or groups of instructions, which affect the execution of the computer software instructions represented by the processing blocks.

The processing and decision blocks can represent steps performed by functionally equivalent circuits such as a digital signal processor circuit or an application specific integrated circuit (ASIC). The flow diagram does not depict the syntax of any particular programming language. Rather, the flow diagram illustrates the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied without departing from the spirit of the invention. Thus, unless otherwise stated the blocks described below are unordered meaning that, when possible, the steps can be performed in any convenient or desirable order.

As illustrated in FIG. 8, an exemplary CVH offset calibration method 800 begins at block 805 where a magnetic field sensor, which can be the same as or similar to magnetic field sensor 300 of FIG. 3, starts CVH offset calibration. As discussed above in conjunction with FIG. 2, an offset is characterized by an output signal from the CVH sensing element, or, more particularly an output signal from each of a plurality of vertical Hall elements of a CVH sensing element, not being representative of a zero magnetic field when the magnetic field sensor is experiencing a zero magnetic field. As described above, it is desirable to reduce the above-referenced offset.

The magnetic field sensor 300 disclosed herein, particularly a potentiometer system (e.g., 320, shown in FIG. 3) of the magnetic field sensor 300 disclosed herein, is configured to attenuate the offset of each one of the one or more magnetic field signals that are sequenced with the differential sequenced signal (e.g., 304*a*, 304*b*, shown in FIG. 3) to produce a magnetic field sensor (e.g., 300, shown in FIG. 3) with reduced offset. The magnetic field sensor with reduced offset can, for example, be achieved by the calibration module 300 of FIG. 3 using the CVH offset calibration method 800 disclosed below.

It is to be appreciated that CVH offset calibration method 800 disclosed below can be performed in the factory at wafer level or at package level testing and calibration. It is also to be appreciated that, although CVH offset calibration method is described as being useful for providing offset calibration to a CVH sensing element, other magnetic field sensing elements, including other types of Hall effect elements, magnetoresistance elements, and magnetotransistor elements can also be used.

Returning now to method 800, at block 810, the magnetic field sensor (e.g., 300 of FIG. 3) is placed in a zero magnetic field environment. Such an environment can be achieved, for example, by magnetic shielding or the like.

At block 815, a CVH indexing value (CVH_INDEX) is set to zero. The CVH indexing value can, for example, be indicative of any arbitrary one of the plurality of vertical Hall elements within the CVH sensing element. Referring briefly to FIG. 3, the calibration sequence clock signal 360*a*, like the clock signal 308*a*, as discussed above, may control and/or indicate switching (or indexing) of the vertical Hall elements.

At block 820, a potentiometer index value (POT_INDEX) associated with a potentiometer (e.g., 322, shown in FIG. 3) of the potentiometer system (e.g., 320, shown in FIG. 3) of the magnetic field sensor 300 is set to zero (POT_INDEX=0), for example, by the calibration module 360 of FIG. 3, via the potentiometer control signal 360*b*. The potentiometer index value (POT_INDEX) of zero can, for example, be indicative of an arbitrary one of a plurality of switch settings and/or offset attenuation factors associated with the potentiometer of the potentiometer system.

At block 832, the calibration module 360, via the ADC 362, reads the offset of the vertical Hall element of the CVH sensing element 302 associated with CVH_INDEX=0 and POT_INDEX=0.

At block 834, the magnetic field sensor determines whether the current potentiometer index value (POT_INDEX) is equal to a maximum potentiometer index value (POT_MAX). If the current potentiometer index value (POT_INDEX) is not equal to the maximum potentiometer index value (POT_MAX), the method proceeds to a block 836.

At block 836, the potentiometer index value (POT_INDEX) of the potentiometer is increased by a particular value which, for example, can be one (POT_INDEX=POT_INDEX+1). Subsequently, the process occurring in blocks 832 and 834 repeatedly loops for the same first one of the plurality of vertical Hall elements, using all possible values of the potentiometer index value (POT_INDEX), and resulting in the calibration module 360 capturing measured offset voltage values for each potentiometer setting for the one selected vertical Hall element within the CVH sensing element 300.

For example, in a second run through blocks 832 and 834 for the first one of the plurality of vertical Hall elements, the potentiometer applies a second offset attenuation factor associated with a second potentiometer index value (e.g., POT_INDEX=POT_INDEX+1) to the differential sequenced signal 304*a*, 304*b* of the first one of the plurality of vertical Hall elements to produce a second attenuated differential sequenced signal. The second potentiometer index value can, for example, be representative of an increased offset attenuation factor (e.g., lower measured offset voltage) associated with the digital potentiometer and an associated switch setting with the increased offset attenuation factor depending on the particular potentiometer utilized in the potentiometer system of the magnetic field sensor.

The number of times blocks 832, 834, and 834 of the attenuation processing segment 830 are repeated depends on the number of different offset attenuation factor selections (e.g., two hundred fifty six), specifically the maximum potentiometer index value (POT_MAX) associated with the potentiometer.

The maximum potentiometer index value (POT_MAX), in the case of a digital potentiometer, can be determined by the number of "digital bits" used for the selection of a desired offset attenuation factor, i.e., eight bits allows for two hundred fifty six different offset attenuation factor selections, ten bits allows for one thousand twenty four, etc. As such, an eight bit digital potentiometer can comprise two hundred fifty six different offset attenuation factor selections and two hundred fifty six potential potentiometer index values (POT_MAX=two hundred fifty six). In some embodiments, only a subset of the available potential potentiometer index values (e.g., one hundred twenty eight of two hundred fifty six) are used in method 800, providing for a lower maximum potentiometer index value (e.g., POT_MAX=one hundred twenty eight).

Once the maximum potentiometer index (POT_MAX) is detected at block 834, the process proceeds to block 838.

At block 838, the calibration module 360 determines which potentiometer index value (POT_INDEX) associated with the current CVH index value (CVH_INDEX), produces an attenuated differential sequenced signal 304*a*, 304*b* closest to zero. The determined "best" potentiometer index value (POT_INDEX) and the associated CVH index value (CVH_INDEX) can be stored at block 838 (or alternatively, at block 860 described below), for example, by the calibration module via signal 360*c*, in the memory device 326 (e.g., EEPROM) for later usage.

From inspection of the digital potentiometer 722 of FIG. 7, it will be understood that some number of lower potentiometer index values produce a differential signal between nodes b and d with an offset voltage that is on one side of zero, and some number of higher potentiometer index values produce a differential signal between nodes b and d with an offset voltage that is on the other side of zero. Thus, the index values are related to offset attenuation factors as used herein, as opposed to merely attenuation factors.

At block 840, the magnetic field sensor determines whether the current CVH index value (CVH_INDEX) is equal to the maximum CVH index value (CVH_MAX). If the current CVH index value (CVH_INDEX) is equal to the maximum CVH index value (CVH_MAX), the method proceeds to a block 850.

At block 850, the CVH index value (CVH_INDEX) is increased by a value (e.g., one), as represented by CVH_INDEX=CVH_INDEX+1, and the method returns to a block 820, where the potentiometer index value (POT_INDEX) is again initialized to zero. According to some embodiments, blocks 820, 830, and 840 are repeated until a "best" offset attenuation factor (i.e., produces an offset voltage closest to zero) is identified by the calibration module for every one of the vertical Hall elements within the CVH sensing element 302. For example, a CVH sensing element comprising sixty-four vertical Hall elements will generally have sixty-four best offset attenuation factors (i.e., one for each vertical Hall element).

At block 840, when the last vertical Hall element associated with the CVH index (i.e., CVH_MAX) has been processed, the CVH offset calibration method 800 subsequently proceeds to block 860.

At block 860, the "best" offset attenuation factor associated with each respective one of the differential sequenced signals produced by the plurality of vertical Hall elements can be programmed into the memory device 326, along with a respective CVH index value representative of a vertical Hall element to which the offset attenuation factor applies. The offset attenuation factors and other information stored in the memory can be accessed by the potentiometer system 320 while the magnetic field sensor 300 is in operation to provide for a magnetic field sensor with reduced offset. The CVH offset calibration method 800 ends at block 870.

In alternate embodiments, the attenuation processing segment 830 can instead use a binary search algorithm or similar means. Using a binary search algorithm, for example, the attenuation processing segment 830 of method 800 can potentially be completed in fewer steps. For example, instead of simply increasing the potentiometer index value (POT_INDEX) by one in a block 836 (POT_INDEX=POT_INDEX+1), the potentiometer system can either increment or decrement the potentiometer index values (POT_INDEX) based on a comparison of a result of a measured offset associated with a first potentiometer index value (e.g., POT_INDEX=zero) and a measured offset associated with a second potentiometer index value (e.g., POT_INDEX=one hundred twenty seven (half way between zero and two hundred fifty five)).

In each step, the binary search algorithm can compare two measured offset voltages and move the potentiometer index value (POT_INDEX) in a next measurement up or down, for example, half way between available up and down ranges to take the next measurement. The binary search algorithm can compare each measurement N with a prior measurement N−1 and can jump the potentiometer index value (POT_INDEX) half way up or down with each comparison, with each measurement measuring a lower offset voltage, arriving at a "best" offset voltage in fewer steps than all steps of digital potentiometer 322.

As described above and will be appreciated by one of skill in the art, embodiments of the disclosure herein may be configured as a system, method, or combination thereof. Accordingly, embodiments of the present disclosure may be comprised of various means including entirely of hardware, entirely of software, or any combination of hardware and software. Furthermore, embodiments of the present disclosure may take the form of a computer program product on a computer-readable storage medium having computer readable program instructions (e.g., computer software) embodied in the storage medium. Any suitable non-transitory computer-readable storage medium may be utilized.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. A magnetic field sensor, comprising:
a plurality of magnetic field sensing elements, each one of the plurality of magnetic field sensing elements having a respective plurality of contacts, wherein the plurality of magnetic field sensing elements is configured to generate a plurality of magnetic field signals, each magnetic field signal responsive to a magnetic field;
a sequence switches circuit coupled to the plurality of magnetic field sensing elements, wherein the sequence switches circuit is coupled to receive a control signal and, in response to the control signal, the sequence switches circuit is configured to sequentially select from among the plurality of magnetic field signals to generate a sequenced output signal representative of sequentially selected ones of the plurality of magnetic field signals;
a memory device configured to store a plurality of potentiometer control values; and
a variable potentiometer coupled to the sequence switches circuit, wherein the variable potentiometer is configured to attenuate an offset of each one of the plurality of magnetic field signals within the sequenced output signal by using a respective plurality of offset attenuation factors responsive to one or more of the plurality of potentiometer control values, wherein each one of the plurality of offset attenuation factors is related to a respective error voltage of a respective one of the plurality of magnetic field signals.

2. The magnetic field sensor of claim 1, wherein the variable potentiometer comprises a plurality of resistors having temperature coefficients selected in accordance with a temperature coefficient of at least one of the error voltages of a respective at least one of the plurality of magnetic field signals.

3. The magnetic field sensor of claim 1, wherein the variable potentiometer comprises a plurality of resistors having temperature coefficients selected in accordance with an average of temperature coefficients of the error voltages of the plurality of magnetic field signals.

4. The magnetic field sensor of claim 1, wherein each one of the plurality of potentiometer control values is also related to a respective error voltage of a respective one of the plurality of magnetic field signals.

5. The magnetic field sensor of claim 1, wherein each one of the plurality of potentiometer control values is selected based upon a measurement of a respective error voltage of a respective one of the plurality of magnetic field signals when the magnetic field sensor is in the presence of zero magnetic field.

6. The magnetic field sensor of claim 1, wherein the error voltage associated with each sequentially selected one of the plurality of magnetic field sensing elements comprises a respective offset voltage component.

7. The magnetic field sensor of claim 1, wherein the error voltage associated with each sequentially selected one of the plurality of magnetic field sensing elements comprises a respective offset voltage component and a respective switching component resulting from switching of the sequence switches circuit.

8. The magnetic field sensor of claim 1, wherein the memory device comprises an EEPROM.

9. The magnetic field sensor of claim 1, wherein the plurality of magnetic field sensing elements comprises vertical Hall elements contained within a circular vertical Hall (CVH) sensing element.

10. The magnetic field sensor of claim 9, wherein the plurality of vertical Hall elements overlap and share one or more of the plurality of contacts of an adjacent one of the plurality of vertical Hall elements.

11. The magnetic field sensor of claim 1, wherein the plurality of magnetic field sensing elements comprises a plurality of vertical Hall elements.

12. The magnetic field sensor of claim 1, wherein the plurality of magnetic field sensing elements comprises a plurality of planar Hall elements.

13. The magnetic field sensor of claim 1, further comprising:
a temperature sensor configured to generate a temperature signal representative of a temperature of the magnetic field sensor, wherein the plurality of offset attenuation factors is scaled in accordance with the temperature signal.

14. The magnetic field sensor of claim 1, further comprising:
a temperature sensor configured to generate a temperature signal representative of a temperature of the magnetic field sensor; and
a potentiometer control logic module coupled to the temperature sensor and configured to select from among the plurality of potentiometer control values in accordance with the temperature signal causing the variable potentiometer to generate the plurality of offset attenuation factors in accordance with the temperature signal.

15. A method, comprising:
generating a plurality of magnetic field signals with a plurality of magnetic field sensing elements, each one of the plurality of magnetic field sensing elements having a respective plurality of contacts, wherein each magnetic field signal is responsive to a magnetic field;
sequentially selecting from among the plurality of magnetic field sensing elements, in response to a control signal, to generate a sequenced output signal representative of sequentially selected ones of the plurality of magnetic field signals;
storing, in a memory device, a plurality of potentiometer control values; and
attenuating an offset of each one of the plurality of magnetic field signals within the sequenced output signal by using a respective plurality of offset attenuation factors responsive to one or more of the plurality of potentiometer control values associated with a variable potentiometer, wherein each one of the plurality of offset attenuation factors is related to a respective error voltage of a respective one of the plurality of magnetic field signals.

16. The method of claim 15, wherein the variable potentiometer comprises a plurality of resistors having temperature coefficients selected in accordance with a temperature coefficient of at least one of the error voltages of a respective at least one of the plurality of magnetic field signals.

17. The method of claim 15, wherein the variable potentiometer comprises a plurality of resistors having temperature coefficients selected in accordance with an average of temperature coefficients of the error voltages of the plurality of magnetic field signals.

18. The method of claim 15, wherein each one of the plurality of potentiometer control values is also related to a respective error voltage of a respective one of the plurality of magnetic field signals.

19. The method claim 15, wherein each one of the plurality of potentiometer control values is selected based upon a measurement of a respective error voltage of a respective one of the plurality of magnetic field signals when the magnetic field sensor is in the presence of zero magnetic field.

20. The method of claim 15, wherein the error voltage associated with each sequentially selected one of the plurality of magnetic field sensing elements comprises a respective offset voltage component.

21. The method of claim 15, wherein the error voltage associated with each sequentially selected one of the plurality of magnetic field sensing elements comprises a respective offset voltage component and a respective switching component resulting from switching of the sequence switches circuit.

22. The method of claim 15, wherein the memory device comprises an EEPROM.

23. The method of claim 15, wherein the plurality of magnetic field sensing elements comprises vertical Hall elements contained within a circular vertical Hall (CVH) sensing element.

24. The method of claim 23, wherein the plurality of vertical Hall elements overlap and share one or more of the plurality of contacts of an adjacent one of the plurality of vertical Hall elements.

25. The method of claim 15, wherein the plurality of magnetic field sensing elements comprises a plurality of vertical Hall elements.

26. The method of claim 15, wherein the plurality of magnetic field sensing elements comprises a plurality of planar Hall elements.

27. The method of claim 15, further comprising:
generating a temperature signal representative of a temperature of the magnetic field sensor, wherein the plurality of offset attenuation factors is scaled in accordance with the temperature signal.

28. The method of claim 15, further comprising:
generating a temperature signal representative of a temperature of the magnetic field sensor; and
selecting from among the plurality of potentiometer control values in accordance with the temperature signal causing the variable potentiometer to generate the plurality of offset attenuation factors in accordance with the temperature signal.

* * * * *

UNITED STATES PATENT AND TRADEMARK OFFICE
CERTIFICATE OF CORRECTION

PATENT NO. : 9,448,288 B2
APPLICATION NO. : 14/282664
DATED : September 20, 2016
INVENTOR(S) : Aurelian Diaconu It is certified that error appears in the above-identified patent and that said Letters Patent is hereby corrected as shown below:

On the Title Page (74), delete "Daley" and replace with --Daly--.

In the Specification

Column 1, Line 28, delete "and" and replace with --an--.

Column 1, Line 35, delete "to magnetic" and replace with --to a magnetic--.

Column 1, Line 38, delete "to magnetic" and replace with --to a magnetic--.

Column 2, Line 50, delete "is" and replace with --and--.

Column 3, Line 8, delete "respective to plurality" and replace with --respective plurality--.

Column 4, Line 13, delete "type II-V" and replace with --type III-V--.

Column 4, Line 56, delete "or digital." and replace with --or digital circuit.--.

Column 5, Lines 32-33, delete "can positioned" and replace with --can be positioned--.

Column 8, Lines 13-14, delete "selected factor" and replace with --selected factors--.

Column 8, Line 39, delete "to the each" and replace with --to each--.

Column 9, Line 53, delete "have in one" and replace with --have one--.

Column 9, Line 54, delete "12C" and replace with --I2C--.

Signed and Sealed this
Thirtieth Day of October, 2018

Andrei Iancu
*Director of the United States Patent and Trademark Office*

CERTIFICATE OF CORRECTION (continued)
U.S. Pat. No. 9,448,288 B2

Column 9, Line 63, delete "306, a" and replace with --306 and a--.

Columns 10-11, Lines 67-1, delete "be electrically" and replace with --be an electrically--.

Column 10, Line 19, delete "sequences" and replace with --sequence--.

Column 12, Line 15, delete "one of the time." and replace with --one at a time--.

Column 12, Line 25, delete "vertical a Hall" and replace with --vertical Hall--.

Column 12, Line 51, delete "Hal" and replace with --Hall--.

Column 13, Line 19, delete "first (" and replace with --(--.

Column 14, Line 8, delete "to actual" and replace with --to an actual--.

Column 14, Line 61, delete "variety factors" and replace with --variety of factors--.

Column 15, Line 40, delete "circuit 304 is illustrated" and replace with --circuit 304 and is illustrated--.

Column 15, Line 41, delete "contacts A-e" and replace with --contacts a-e--.

Column 15, Line 62, delete "respect the" and replace with --respect to--.

Column 17, Lines 36-37, delete "method is" and replace with --method 800 is--.

Column 18, Line 6, delete "to a block" and replace with --to block--.

Column 18, Line 35, delete "blocks 832, 834, and 834" and replace with --blocks 832, 834, and 836--.

Column 19, Line 15, delete "to a block" and replace with --to block--.

Column 19, Lines 19-20, delete "to a block" and replace with --to block--.

Column 19, Line 50, delete "in a block" and replace with --in block--.

Column 20, Line 21, delete "that that" and replace with --that the--.

In the Claims

Column 22, Line 21, delete "The method claim 15" and replace with --The method of claim 15,--.